United States Patent
Udagawa

[11] Patent Number: 6,153,894
[45] Date of Patent: Nov. 28, 2000

[54] GROUP-III NITRIDE SEMICONDUCTOR LIGHT-EMITTING DEVICE

[75] Inventor: Takashi Udagawa, Saitama, Japan

[73] Assignee: Showa Denko Kabushiki Kaisha, Tokyo, Japan

[21] Appl. No.: 09/438,788

[22] Filed: Nov. 12, 1999

Related U.S. Application Data

[60] Provisional application No. 60/153,958, Sep. 15, 1999.

[30] Foreign Application Priority Data

Nov. 12, 1998 [JP] Japan ................................. 10-322456

[51] Int. Cl.[7] .................................................. H01L 33/00
[52] U.S. Cl. ............................. 257/96; 257/97; 257/13; 257/103; 257/76
[58] Field of Search ............................ 257/13, 14, 96, 257/97, 103, 76, 15

[56] References Cited

U.S. PATENT DOCUMENTS

| | | | |
|---|---|---|---|
| 4,905,059 | 2/1990 | Shur . | |
| 5,684,309 | 11/1997 | McIntosh et al. | 257/191 |
| 5,729,029 | 3/1998 | Rudaz | 257/13 |
| 5,828,086 | 10/1998 | Ishibashi et al. | 257/94 |
| 5,886,367 | 3/1999 | Udagawa | 257/64 |
| 6,040,588 | 3/2000 | Koide et al. | 257/15 |
| 6,046,464 | 4/2000 | Schetzina | 257/96 |

FOREIGN PATENT DOCUMENTS

| | | |
|---|---|---|
| 0 731 512 A2 | 9/1996 | European Pat. Off. . |
| 0 877 428 A2 | 11/1998 | European Pat. Off. . |
| 197 34 034 A1 | 2/1998 | Germany . |
| WO 98/40916 | 9/1998 | WIPO . |

OTHER PUBLICATIONS

G. Abstreiter, *Semiconductor Heterostructures*, Siemens Forsch–u. Entwickl.–Ber. Bd. 15 P(1986) Nr. 6, pp. 312–318.

*Primary Examiner*—John Guay
*Attorney, Agent, or Firm*—Sughrue, Mion, Zinn, Macpeak & Seas, PLLC

[57] ABSTRACT

Light-emitting device with excellent emission intensity is difficult to obtain when gallium indium nitride with high indium composition ratio and poor crystallinity is employed as active layer for group-III nitride light-emitting device to emit a comparatively long wavelength light. The invention provides a light-emitting layer on a super lattice structure as a base layer, and crystallinity of the light-emitting layer is then improved. Furthermore, abruptness of a crystal composition at an interface of the light-emitting layer and an upper junction layer is achieved, thus forming a bending portion of a band structure expedient for allowing the emitting-layer to emit a light with a long wavelength.

8 Claims, 8 Drawing Sheets

GROUP-III NITRIDE SEMICONDUCTOR LIGHT-EMITTING DEVICE

CROSS REFERENCE TO RELATED APPLICATIONS

This application is an application filed under 35 U.S.C. §111(a) claiming benefit pursuant to 35 U.S.C. §119(e)(i) of the filing date of Provisional Application 60/153,958 filed Sep. 15, 1999 pursuant to 35 U.S.C. §111(b).

FIELD OF THE INVENTION

The present invention relates to technology for obtaining a short-wave light-emitting device made of a group-III nitride semiconductor crystal, particularly to technology for fabricating a light-emitting layer which results in a high brightness luminescent light and in emission of a longer wavelength of light.

BACKGROUND OF THE INVENTION

A light-emitting diode (LED) and a laser diode (LD) which emit short-wave visible light from reddish orange band to bluish purple band, near ultraviolet, and ultraviolet band are fabricated using $Al_xGa_yIn_zN$ ($0 \leq X, Y, Z \leq 1, X+Y+Z=1$) crystal materials classified as group III nitride semiconductors (see, for example, Japanese Examined Patent Publication No. S55-3834). Also, group-III nitride semiconductors such as $Al_xGa_yIn_zN_QM_{1-Q}$ ($0 \leq L, Y, Z \leq 1, X+Y+Z=1$; where M represents a group-V element other than nitrogen, and $0<Q<1$) containing group-V elements such as phosphorus (P) and arsenic (As) in addition to nitrogen (N) have been used for fabricating group-III nitride semiconductor light-emitting devices (see Japanese Unexamined Patent Publications No. H4-192585, H4-192586, H10-84163 and EP No. 0496030A2).

In these group-III nitride semiconductor light-emitting devices, a light-emitting portion has heretofore been formed usually by a pn-junction type double hetero (DH) structure which conveniently emits a high intensity luminescent light (see Japanese Unexamined Patent Publication No. H6-260283). N and p-type cladding layers forming the light-emitting portion of the DH structure by interposing a light-emitting layer therebetween have heretofore been made usually of $Al_xGa_yN$ ($0 \leq X, Y \leq 1, X+Y=1$) (*Jpn. J. Appl. Phys.,* Vol. 32, 1993, pp. L8–L11). The light-emitting layer is practically made of n-type $Ga_yIn_zN$ ($0<Y, Z<1, Y+Z=1$) (see Japanese Examined Patent Publication No. S55-3834). This is because a band gap convenient for obtaining a light with a wavelength from near ultraviolet region to short-wave visible light region, that is, about 360 nm to about 560 nm, is given by adjusting the indium composition ratio (=Z).

For example, $Ga_{0.94}In_{0.06}N$ which has an indium composition ratio (=Z) of 0.06 is used for blue band LEDs composed of a single group-III nitride semiconductor light-emitting layer (see *J. Vac. Sci. Technol. A,* 13(3), 1995, pp. 705–710). An example in which $Ga_{0.55}In_{0.45}N$ adopting a further increased indium composition ratio of 0.45 is used as a well layer is known (see *Jpn. J. Appl. Phys.,* 34 (Part 2), No. 10B, 1995, pp. L1332–L1335).

A conventional example in which the light-emitting layer is formed by a single quantum well (SQW) structure or a multi quantum well (MQW) structure is known (see *Mat. Res. Soc. Symp. Proc.,* Vol. 449, 1997, pp. 1203–1208). This is because if the quantum well structure is adopted, light-emitting spectrum can be narrowed, resulting in an excellent monochromatic light emission. An example in which a well layer provided in the SQW or MQW structure, which forms the light-emitting portion of a visible light-emitting device, is also made of $Ga_yIn_zN$ ($0<Y, Z<1, Y+Z=1$) is also known (see *Jpn. J. Appl. Phys.,* 35 (Part 2), No. 1B, 1996, pp. L74–L76).

As a matter of course, a barrier layer located at a position facing the well layer is made of a group-III nitride semiconductor material showing a larger band gap than that of the constituent material of the well layer. In the conventional example, the barrier layer is usually made of $Al_xGa_yN$ ($0 \leq X, Y<1, X+Y=1$) (see Japanese Unexamined Patent Publication No. H10-163571). It is usual that, regardless of the SQW and MQW structures, light with a wavelength shorter than that corresponding to the band gap of $Ga_yIn_zN$ forming the well layer arises from the light-emitting layer of the quantum well structure adopting a conventional rectangular potential structure type owing to a quantum level created in the well layer.

It is also known in the art that the light-emitting layer can be composed of a layer having a strain, i.e., a strained layer (see Japanese Unexamined Patent Publication No. H7-297476). In this prior art, $In_{0.2}Ga_{0.8}N$ having a thickness of 7 nm is used for a well layer that is a light-emitting layer. On the other hand, a strained-layer super lattice (SLS) structure constructed by stacking the strained layer is mainly utilized as constituent components other than the light-emitting portion. For example, the SLS structure made of $Al_yGa_{1-x-y}In_xN$ ($0 \leq x, y \leq 1, 0 \leq x+y<1$) is utilized as a dislocation-reduction-layer for preventing dislocations in a buffer layer from propagating to an active (light-emitting) layer of a DH structure light-emitting portion (see Japanese Unexamined Patent Publication No. H8-264833). Moreover, prior art in which a SLS structure made of $Al_dGa_{1-c-d}In_cN$ ($0 \leq c, d \leq 1, 0 \leq c+d<1$) and $Al_yGa_{1-y}In_xN$ ($0 \leq x, y \leq 1, 0 \leq x+y<1$) is located below the DH structure light-emitting portion is known in the art similarly to the prior art described above (see Japanese Unexamined Patent Publication No. H6-152072). Besides these, an example is known, in which a buffer layer is formed in an SLS structure made of AlN and GaN (see Japanese Unexamined Patent Publication No. H3-203388).

As described above, the conventional light-emitting portion is composed of the single layer, the quantum well structure, or the structure regarded as the quantum well structure. The light-emitting layer composed of the single layer is one composed of a single group-III nitride semiconductor layer numerically, not compositionally. In order to obtain a single light-emitting layer (well layer) made of $Ga_yIn_zN$ that emits light with a longer wavelength, it is necessary to form the light-emitting layer from a $Ga_yIn_zN$ layer having a large indium composition ratio (=Z). As a matter of course, with reference to the quantum well structure using the conventional rectangular potential structure, a well layer must be composed of a $Ga_yIn_zN$ layer having an even larger indium composition ratio compared to a light-emitting layer composed of a single layer. This is because the transition energy between the carriers increases owing to a quantum level created in the rectangular potential well layer.

On the other hand, from the viewpoint of growth technology for $Ga_yIn_zN$ forming the light-emitting layer and the well layer, it is necessary to lower a growth temperature to obtain the $Ga_yIn_zN$ having a large indium composition ratio (=Z). However, it has been reported that a $Ga_yIn_zN$ grown at a low temperature near 500° C. shows poor crystallinity (see *The Journal of the Institute of Electronics, Information and*

Communication Engineer, Vol. 76, No. 9 (September, 1993), pp. 913–917). The crystallinity of the group-III nitride semiconductor crystal layer forming the light-emitting layer appears as a level of a light-emitting intensity. In other words, the use of the $Ga_yIn_zN$ crystal layer with poor crystallinity is disadvantageous for obtaining a nitride semiconductor light-emitting device which emits a high intensity light.

If a light-emitting layer or a well layer capable of emitting visible light with a comparatively long wavelength can be constructed using a $Ga_yIn_zN$ crystal layer grown at a high temperature near 800° C. (see *J. Insti. Electron. Infor. Communi. Eng.*), which has excellent crystallinity because of a low indium composition ratio, a group-III nitride semiconductor light-emitting device emitting high intensity light can be advantageously acquired. However, since its band gap at room temperature is increased with a decrease in the indium composition ratio (see Japanese Examined Patent Publication No. S55-3834), disadvantage that such $Ga_yIn_zN$ crystal layer is hardly used as a suitable constituent material for forming a light-emitting layer which emits light with a wavelength of a bluish green or a green bands occurs. Particularly, a rectangular potential well layer formed by the $Ga_yIn_zN$ crystal layer having the such comparatively low indium composition ratio is more disadvantageous to radiate a short-wavelength visible light with a wavelength of, for example, a green band.

Even when the $Ga_yIn_zN$ crystal layer having a low indium composition ratio (=Z), and excellent crystallinity is used as a constituent material of the single light-emitting layer or the potential well, it is possible to form a group-III nitride semiconductor light-emitting device emitting a high intensity luminescent light, provided that a light-emitting layer capable of readily emitting visible light with a longer wavelength can be developed.

Furthermore, if technical procedure for stably improving the crystallinity of the $Ga_yIn_zN$ crystal layer forming the light-emitting layer or the well layer consciously can be done, as a matter of course this makes it quite advantageous to obtain a group-III nitride semiconductor light-emitting device to emit a high intensity light in a more stable manner.

SUMMARY OF THE INVENTION

A first object of the present invention is to find means for avoiding any disadvantage in improvement of emission intensity of a group-III nitride semiconductor light-emitting device because of the necessity of a form of a light-emitting layer using a $Ga_yIn_zN$ crystal layer with a poor crystallinity, due to a comparatively large indium composition ratio to emit a light with a wavelength of a green band or longer. In other words, an object of the present invention is to propose a technical means for forming a light-emitting portion composed of a simple junction structure different from a quantum well suture having the conventional rectangular potential structure, which is capable of functioning to radiate a short-wavelength visible light with a wavelength of a blue band or a green band even when the light-emitting layer is made of a $Ga_yIn_zN$ crystal layer with an excellent crystallinity because of its low indium composition ratio.

Furthermore, a second object of the present invention is to propose a junction structure relating to a light-emitting layer made of a $Ga_yIn_zN$ crystal layer capable of contributing to an emission of a high intensity luminescent light, in association with the structure of the light-emitting layer advantageous for emitting a high intensity luminescent light.

A group-III nitride semiconductor light-emitting device of the present invention as defined herein taking a double hetero (DH) junction structure of a pn-junction type which comprises an n-type cladding layer and a p-type cladding layer formed on one surface of a single-crystal substrate, and a light-emitting layer made of a group-III nitride semiconductor crystal layer provided between the n and p-type cladding layers, wherein the light-emitting layer includes a super lattice structure in which n-type group-III nitride semiconductor crystal layers disposed closer to the n-type cladding layer are alternately stacked, the n-type group-III nitride semiconductor crystal layers having different composition ratios of a group-III constituent element and approximately the same layer thickness and the number of pairs of the n-type group-III nitride semiconductor crystal layers stacked repeatingly (hereinafter referred to as the stacking cycle number) ranging from two pairs to twenty pairs; and an active layer made of an n-type group-III nitride semiconductor crystal layer provided on a layer (upper end layer) which is located at an end of the super lattice structure closer to the p-type cladding layer, the n-type group-III nitride semiconductor crystal layer having a non-rectangular potential structure owing to a bend of a band.

Furthermore, the group-III nitride semiconductor light-emitting device of the invention as described herein comprises the super lattice structure as the one assuming a non-quantum well structure in which two kinds of layers made of conductive n-type aluminum gallium indium nitride mixed-crystal ($Al_xGa_yIn_zN$: $0 \leq X<1$, $0 \leq Y<1$, $0 \leq Z<1$, X+Y+Z =1) are alternately stacked, each of the layers having a difference of 5 nm or less in layer thickness and a different composition ratio of a group-III constituent element.

The group-III nitride semiconductor light-emitting device of the invention described herein, comprises the active layer composed of a well layer provided on an end of a quantum well structure adjacent to the p-type cladding layer, the quantum well structure being composed of well layers including said well layer and barrier layers, each of which is stacked alternately with a stacking cycle number of 5 or less, the well layers being made of a gallium indium nitride mixed-crystal ($Ga_yIn_zN$: $0.7 \leq Y<1$, $0<Z \leq 0.3$, Y+Z=1) having an indium composition ratio of 0.3 or less and the barrier layers made of a gallium indium nitride mixed-crystal ($Ga_BIn_CN$: Y<B<1, 0<C<Z, B+C=1) having an indium composition ratio smaller than that of the $Ga_yIn_zN$ mixed-crystal.

The group-III nitride semiconductor light-emitting device of the invention as described herein comprises the active layer as a single gallium indium nitride mixed-crystal layer directly joined to the upper end layer of the supper lattice structure.

The group-III nitride semiconductor light-emitting device of the invention as described herein comprises the active layer formed of a gallium indium nitride mixed-crystal of a multi-phase structure which is composed of a plurality of Ga$\alpha$In$\beta$N crystal phases ($0 \leq \alpha<1$, $\alpha+\beta=1$), each crystal phase having a different indium composition ratio (=$\beta$) from others.

The group-III nitride semiconductor light-emitting device of the invention as described herein comprises the active layer formed of a matrix phase mainly made of an n-type group-III nitride semiconductor crystal of the same composition as that of an n-type group-III nitride semiconductor, which forms a layer underneath the active layer (the layer on which the active layer is deposited) which is hereinafter referred to as a "deposited layer" stacking the active layer thereon, and a sub-phase made of a Ga$\alpha$In$\beta$N crystal having a different indium composition ratio from that of the matrix phase.

The group-III nitride semiconductor light-emitting device of the invention as described herein comprises the active layer composed of an n-type gallium indium nitride mixed-crystal ($Ga_yIn_zN$: $0.7 \leq Y<1$, $0<Z \leq 0.3$, $Y+Z=1$) which has a bending portion of a conduction band or a valence band toward a Fermi level at a region in the vicinity of a junction interface closer to the p-type cladding layer and an indium composition ratio ($=Z$) of 0.3 or less.

The group-III nitride semiconductor light-emitting device of the invention as described herein is an n-type aluminum gallium nitride mixed-crystal ($Al_xGa_yN$: $0 \leq X \leq 1$, $0 \leq Y \leq 1$, $X+Y \leq 1$) containing p-type impurities grown between the active layer and the p-type cladding layer, and the active layer composed of an n-type gallium indium nitride mixed-crystal ($Ga_yIn_zN$: $0.7 \leq Y<1$, $0<Z \leq 0.3$, $Y+Z=1$) which has a bending portion of a conduction band toward a Fermi level at a region in the vicinity of a junction interface with the n-type aluminum gallium nitride mixed-crystal containing the p-type impurities, and an indium composition ratio ($=Z$) of 0.3 or less.

These embodiments of the invention are described more specifically below.

In a first embodiment, this invention provides a group-III nitride semiconductor light-emitting device which takes a pn-junction type double hereto (DH) junction structure which comprises an n-type cladding layer and a p-type cladding layer formed on one surface of a single crystal substrate, and a light-emitting layer made of a group-III nitride semiconductor crystal layer provided between the n and p-type cladding layers, wherein the light-emitting layer includes a super lattice structure in which n-type group-III nitride semiconductor crystal layers disposed closer to the n-type cladding layer are alternately stacked repeatingly, the n-type group-III nitride semiconductor crystal layers having different composition ratios of a group-III constituent element and approximately the same thickness and the stacking cycle number ranging from two pairs to twenty five pairs; and an active layer made of an n-type group-III nitride semiconductor crystal layer provided on a layer as an upper end layer which is located at an end of the super lattice structure closer to the p-type cladding layer, the n-type group-III nitride semiconductor crystal layer having a non-rectangular potential structure due to a bend of a band.

In a second embodiment, the invention provides a group-III nitride semiconductor light-emitting device as in the first embodiment, wherein said super lattice structure is the one assuming a non-quantum well structure in which two kinds of layers made of conductive n-type aluminum gallium indium nitride mixed-crystal of the formula $Al_xGa_yIn_zN$: $0 \leq X<1$, $0 \leq Y \leq 1$, $0<Z<1$, $X+Y+Z=1$ are alternately stacked on another, each of the layers having a difference of 5 nm or less in thickness and a different composition ratio in a group-III constituent element.

In a third embodiment, the invention provides a group-III nitride semiconductor light-emitting device as in the first or second embodiment wherein the active layer is formed of a well layer that is an end layer of a quantum well structure adjacent the p-type cladding layer, the quantum well structure being composed of a stacking structure composed of the well layers including the well layer and barrier layers which are alternately stacked with a stacking cycle number of 5 or less, the well layers being made of a gallium indium nitride mixed-crystal of the formula $Ga_yIn_zN$: $0.7 \leq Y<1$, $0<Z \leq 0.3$, $Y+Z=1$ having an indium composition ratio of 0.3 or less, and the barrier layers being made of a gallium indium nitride mixed-crystal of the formula $Ga_BIn_CN$: $Y<B<1$, $0<C<Z$, $B+C=1$ having an indium composition ratio smaller than that of the $Ga_yIn_zN$ mixed-crystal.

In a fourth embodiment, this invention provides a group-III nitride semiconductor light-emitting device as in any of the first, second or third embodiments, wherein the active layer is made of a single gallium indium nitride mixed-crystal layer directly joined to the upper end layer of the super lattice structure.

In a fifth embodiment, this invention provides a group-III nitride semiconductor light-emitting device as in the first, second, third or fourth embodiments, wherein the active layer is made of a gallium indium nitride mixed-crystal of a multi-phase structure which is composed of a plurality of $Ga\alpha In\beta N$ crystal phases where $0 \leq \alpha<1$, $\alpha+\beta=1$ each crystal phase having a different indium composition ratio ($=\beta$) from the other crystal phases.

In a sixth embodiment, this invention provides a group-III nitride semiconductor light-emitting device according to the fifth embodiment, wherein said active layer comprises a matrix phase mainly of an n-type group-III nitride semiconductor crystal of the same composition as that of an n-type group-III nitride semiconductor, which forms a lower deposited layer stacking the active layer thereon; and a sub-phase made of a $Ga\alpha In\beta N$ crystal having an indium composition ratio different from that of the matrix phase where $\alpha$ and $\beta$ are as described in claim 5.

In a seventh embodiment, this invention provides a group-III nitride semiconductor light-emitting device according to any one of the first through sixth embodiments, wherein the active layer is made of an n-type gallium indium nitride mixed-crystal of the formula $Ga_yIn_zN$: $0.7 \leq Y<1$, $0<Z<0.3$, and $Y+Z=1$ having a band structure in which a bending portion of a conduction band or a valence band bends toward a Fermi level at a region in the vicinity of a junction interface closer to the p-type cladding layer and an indium composition ratio ($=Z$) of 0.3 or less.

In an eighth embodiment, the invention provides a group-III nitride semiconductor light-emitting device according to any one of the first through seventh embodiments, wherein an n-type aluminum gallium nitride mixed-crystal of the formula $Al_xGa_yN$: $0 \leq X<1$, $0 \leq Y \leq 1$, $X+Y=1$ containing p-type impurities is grown between the active layer and the p-type cladding layer, and the active layer is made of an n-type gallium indium nitride mixed-crystal of the formula $Ga_yIn_zN$: $0.7 \leq Y<1$, $0<Z \leq 0.3$, $Y+Z=1$ having a band structure in which a bending portion of a conduction band bends toward a Fermi level at a region in the vicinity of a junction interface with the n-type aluminum gallium nitride mixed-crystal containing the p-type impurities, and an indium composition ratio ($=Z$) of 0.3 or less.

DESCRIPTION OF THE PREFERRED EMBODIMENTS

Figure 1:
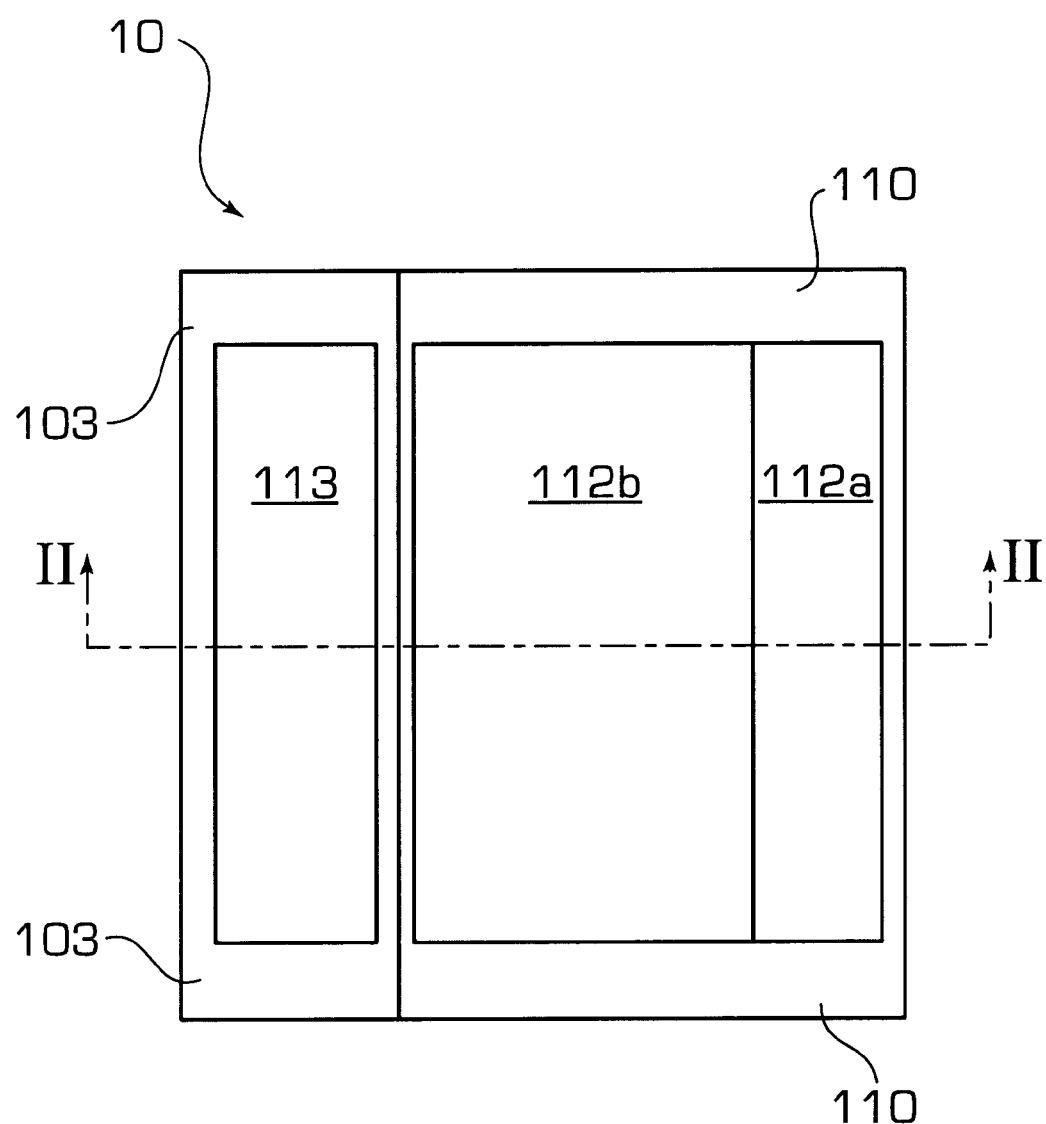
FIG. 1 is a schematic plan view of an LED according to Example 1 of the present invention.

A light-emitting layer consists of two portions in the first embodiment of the present invention. One is a super lattice structure portion composed of a group-III nitride semiconductor crystal layer. The other is an active layer composed of an indium-containing group-III nitride semiconductor crystal provided on the super lattice structure. To be short first, the foregoing super lattice structure is provided for improving the crystallinity of the group-III nitride semiconductor crystal layer which forms the active layer located on the super lattice structure. The active layer is a layer which brings about a light emission practically, that is, emits light substantially.

The super lattice structure composed of the group-III nitride semiconductor crystal layer, which is one constituent component of the light-emitting layer, is provided on a lower cladding layer made of, for example, an n-type gallium nitride (GaN). The super lattice structure must essentially be composed of a conductive and low resistance group-III nitride semiconductor crystal layer. More specifically, the super lattice structure of the present invention is a super lattice structure showing an excellent electrical conductivity, and the super lattice structure achieves an electric conduction with a lower cladding layer due to its excellent electrical conductivity. A group-III nitride semiconductor layer showing a carrier concentration of about $1\times10^{18}$ cm$^{-3}$ and a specific resistance (resistivity) of about several milli-ohm (mΩ) or less, which has excellent electrical conductivity, is suitable for constructing the super lattice structure. The group-III nitride semiconductor crystal layer with an excellent electrical conductivity can be obtained in a stable manner by intentionally doping either p-type impurities or n-type impurities thereinto. In the present invention, in view of the situation that the super lattice structure should be composed of an n-type group-III nitride semiconductor crystal layer, it is most suitable that the super lattice structure is composed of a low resistance n-type group-III nitride semiconductor crystal layer into which n-type impurities such as silicon (Si), sulfur (S), tin (Sn), and selenium (Se) are doped.

The thickness of each layer forming the super lattice structure need not always to be reduced to a critical thickness or less as to strains, unlike the form of the conventional SLS structure. The thin layer of the group-III nitride semiconductor crystal having the critical thickness or less is capable of principally functioning as a quantum well layer. However, in the present invention, for a later described reason, the super lattice structure is avoided to form from a quantum well structure exhibiting a sufficient quantum effect. Accordingly, in order to prevent the super lattice structure from exhibiting a sufficient function as the quantum well layer and to set the quantum level to 50 meV volt or less at most if the super lattice structure is composed of the quantum well structure, the thickness of each layer forming the super lattice structure shall be set to about 20 nm or more. The thickness thereof should be set to about 40 nm or more, and should most preferably range from about 50 nm to about 70 nm. In other words, the super lattice structure of the present invention which forms a part of the light-emitting layer is not composed of the quantum well structure or the strained-layer super lattice (SLS) structure, but is preferably a simple super lattice structure which has excellent electrical conductivity, formed of a simple stacking of group-III nitride semiconductor crystal layers having a thickness ranging from about 50 nm to 70 nm, and exhibiting almost no quantum effect.

The super lattice structure is formed by stacking the group-III nitride semiconductor crystal layers, each of which shows a different composition ratio of a group-III element, or different composition ratios of group-III and group-V elements. In the present invention, the thicknesses of the group-III nitride semiconductor crystal layers are set to be approximately equal to each other. Specifically, the super lattice structure of the present invention is not formed using the barrier layer and the well layer, which have different thicknesses from each other like the conventional quantum well structure, but composed of the crystal layers having approximately the same thickness, thereby significantly restricting generation of the quantum level.

The super lattice structure is constructed by stacking unit structure composed of a pair of stacking layers, each of which has a different composition ratio of a constituent element, by at least two pairs (two cycles or more). The only stacking unit structure, that is, the stacked structure system of the only one cycle, do not act sufficiently to suppress penetration of crystal defects and dislocations, for example, from the buffer layer and the lower cladding layer. On the contrary, if the stacking cycle number is made to be relatively large, for example, if the number of cycles is made to be 30 or more, roughness of the surface layer of the stacking structure system may range from several tens to several hundreds Å as a simple step difference. The step difference of this surface layer has a tendency to be enlarged as the cyclic structure forming the super lattice structure system increases, that is, as the number of junction interfaces formed by the constituent layers in relation of lattice mismatching increases and the total thickness of the layers increases. For this reason, the stacking structure system provided in such super lattice structure system is degraded in surface flatness.

Particularly, where the super lattice structure is formed by thin layers of approximately the same thickness as the surface step difference produces a factor resulting not only in the thin layer lacking surface flatness, but also in the thin layer lacking continuity. Since the thin layer lacking continuity increases current resistance, expansion of the light-emitting area is, for example, obstructed with an increase of forward bias and a spreading resistance is created in the light-emitting device. As a result, if the stacking cycle number for forming the super lattice structure is set to less than 25, and more preferably ranges from 10 to 15, penetration of crystal defects from the lower layer can be prevented, and the super lattice structure can be formed without degradation of the flatness of the surface. The total thickness of the layers forming the super lattice structure should be restricted to be slightly larger than 1 μm. In order to suppress the propagation of the crystal defects from the lower layer to the upper layer effectively, the number of cycles must be set to at least two as described above.

In the foregoing super lattice structure provided on the n-type cladding layer, an initial layer of the super lattice structure joined to the n-type cladding layer should preferably be formed of a group-III nitride semiconductor crystal having a band gap larger than that of the group-III nitride semiconductor crystal which forms the junction region of the n-type cladding layer. The initial layer of the super lattice structure should be formed a group-III nitride semiconductor crystal material having a band off-set of about 0.2 eV or less, more preferably ranging from about 0.1 eV to about under 0.2 eV to the group-III nitride semiconductor crystal forming the region in the vicinity of the junction region of the n-type cladding layer. If a group-III nitride semiconductor crystal layer, which forms an extraordinarily high band off-set exceeding about 0.3 eV on the conduction band side is directly joined to the n-type cladding layer, the disadvantage arises that smooth current flow to a light-emitting layer provided on the super lattice structure is disturbed.

On the contrary, as an extreme case, when the initial layer of the super lattice structure is formed of a group-III nitride semiconductor crystal generating no band off-set, an operating current flows advantageously to the super lattice structure. A situation where the band off-set is extremely small occurs when the initial layer is formed of a group-III nitride semiconductor crystal which is made of a material having approximately the same band gap, that is, approximately the same material as a constituent material of the n-type cladding layer. However, in a super lattice structure provided to prevent propagation of crystal defects from the lower layer, it is by no means preferable to form the initial layer of the super lattice structure by a crystal material having approximately the same composition as that of the n-type cladding layer, that is, approximately the same composition ratio of the constituent element as that of the n-type cladding layer. Accordingly, in order to obtain a super lattice structure capable of improving crystallinity of the upper layer, it is preferable to form the initial layer with a group-III semiconductor crystal which has a composition ratio different enough from that of a material forming the n-type cladding layer to generate the band offset of at least about 0.1 eV or more.

Figure 12:
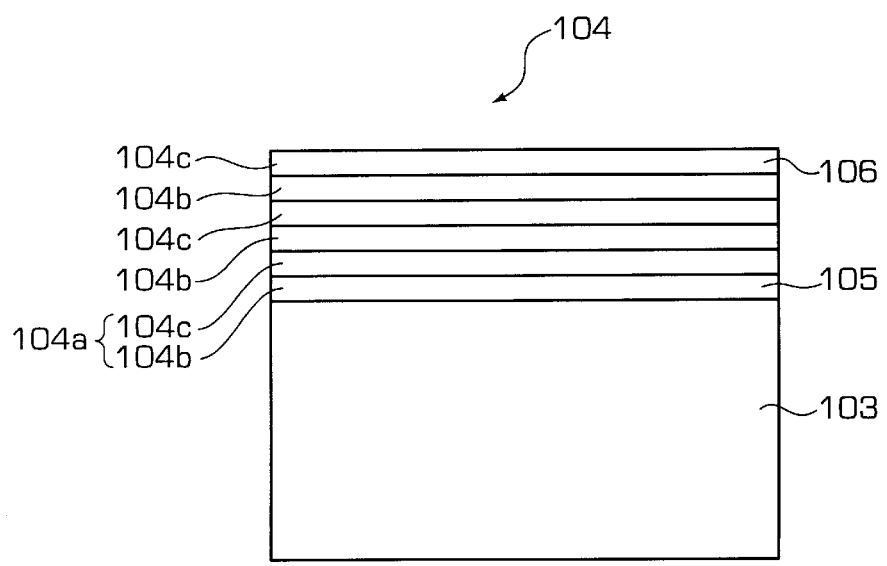
FIG. 12 is a sectional view showing an example of the form of a super lattice structure of the present invention.

An example of the super lattice structure in which the initial layer is arranged on the surface of the n-type lower cladding layer is shown in FIG. 12. A first constituent layer 104b of a stacking structure unit 104a joined to the lower cladding layer 103 is the initial layer 105 of the present invention. A stacking structure unit 104a that is a constituent unit of a super lattice structure 104 is composed of the first constituent layer 104b and a second constituent layer 104c. The super lattice structure 104 of FIG. 12 is constructed by stacking the structure unit 104a by three (three cycles for each of the first and second constituent layers 104b and 104c). Regardless of the stacking cycle number, in the periodic super lattice structure 104 having the initial layer 105 as the first constituent layer 104b, the second constituent layer 104c forms a layer (upper end layer) 106 located the end closer to the p-type cladding layer of the super lattice structure 104.

In the present invention, since the stacking cycle number of the stacking structure unit 104a forming the super lattice structure 104 exemplified in FIG. 12 is regarded as important, a crystal layer forming the upper end layer 106 may also be composed by the first constituent layer 104b. Describing the super lattice structure 104 of FIG. 12 as an example, when the first constituent layer 104b is further stacked on the second constituent layer 104c serving as an end of the super lattice structure 104 under which the first and second constituent layers 104b and 104c are stacked by three cycles, the super lattice structure in which an upper end layer 106 is formed by the first constituent layer 104b can be obtained.

Furthermore, in the present invention, a conductive n-type gallium indium nitride mixed-crystal ($Ga_BIn_CN$: B+C=1) is deposited on the upper end layer of the super lattice structure as an active layer, thus forming a light-emitting layer. If the super lattice structure is used as a base layer, the active layer with especially excellent crystallinity can be formed. In other words, the above-described super lattice structure functions to bring about the $Ga_BIn_CN$ active layer with excellent crystallinity as a layer, which actually emits light. In the present invention, an n-type $Ga_BIn_CN$ active layer is arranged so as to face a p-type cladding layer forming a light-emitting portion of a pn-junction type DH structure.

This is because by arranging the n-type $Ga_BIn_CN$ active layer serving as the substantial light-emitting layer to be adjacent to the p-type cladding layer, radiation recombination with holes showing a small diffusion length, which is supplied from the p-type cladding layer at the time of application of a forward voltage, can be effectively performed in the n-type $Ga_BIn_CN$ crystal layer. The explanation is as follows; the n-type $Ga_BIn_CN$ active layer acts as a substantial light-emitting portion which brings about light emission, and the super lattice structure effectively acts as a base for bringing about the light-emitting portion with excellent crystallinity.

Figure 13:
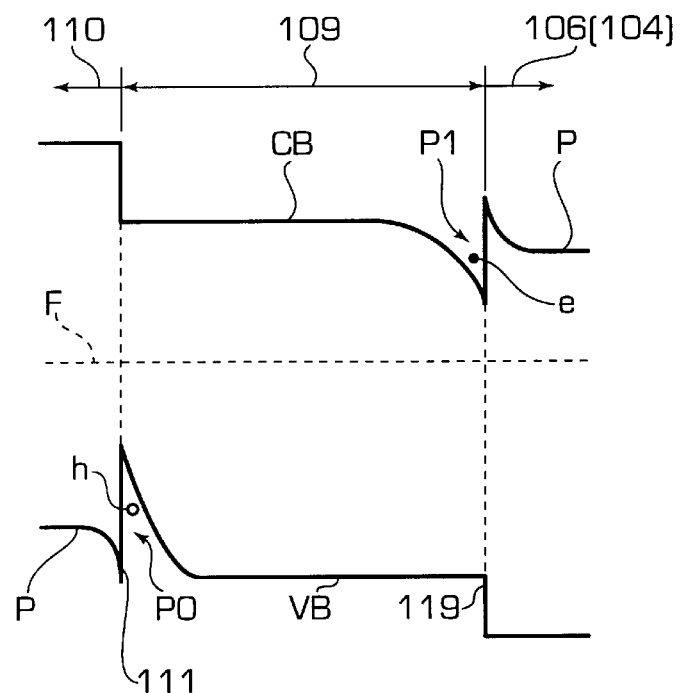
FIG. 13 is a drawing showing an example of a non-rectangular potential structure of an active layer of the present invention.

The following is previously described as a seventh embodiment of the present invention. A band structure for creating a non-rectangular potential structure unlike for the conventional light-emitting layer is given to the n-type $Ga_BIn_CN$ crystal layer forming the active layer, so as to achieve a short-wavelength light emission over a wide wavelength range in spite of a low indium composition ratio. The band structure giving the non-rectangular potential structure according to the present invention is exemplified in FIG. 13. The potential structure of FIG. 13 is an example in which the n-type $Ga_BIn_CN$ active layer 109 is directly joined to the p-type cladding layer 110. The non-rectangular potential structure P given to the n-type $Ga_BIn_CN$ active layer 109 is a structure in which the valence band VB is substantially flat on the junction interface 119 side with the upper end layer 106 of the super lattice structure 104 and inclines from the Fermi level F toward a far direction uniformly, and drops extremely toward the Fermi level F at the region in the vicinity of the junction interface 111 with the p-type cladding layer 110, thus forming a potential well P0. On the other hand, the conduction band CB rapidly drops toward the Fermi level F at the region in the vicinity of the junction interface 119 with the upper end layer 106, thus forming the potential well P1.

Figure 14:
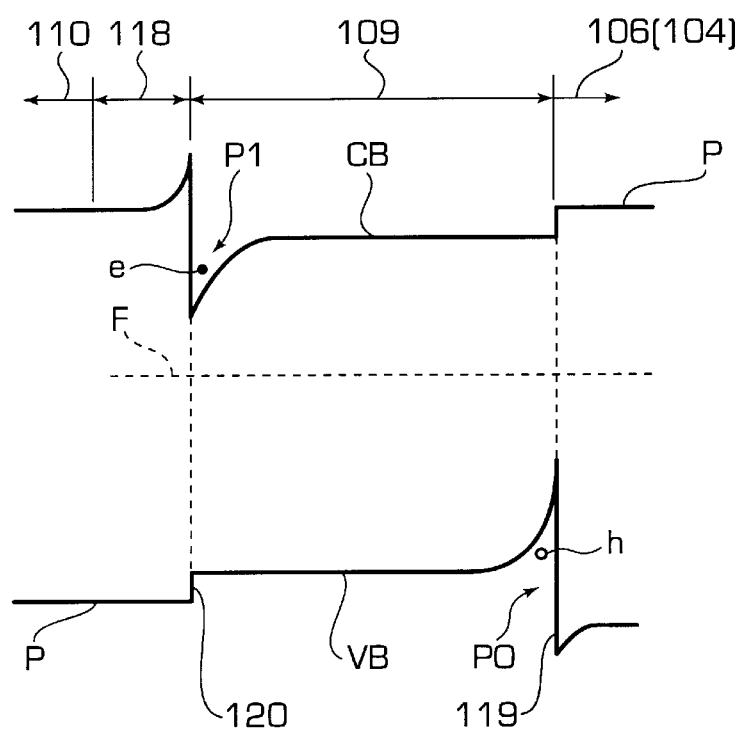
FIG. 14 is a drawing showing another example of the non-rectangular potential structure of the active layer of the present invention.

The following is previously described as an eighth embodiment of the present invention. Where the n-type $Ga_BIn_CN$ active layer 109 is directly joined to the n-type crystal layer 118 interposed between the p-type cladding layer 110 and the active layer 109, the non-rectangular potential structure P given to the n-type $Ga_BIn_CN$ active layer 109 is exemplified in FIG. 14. Specifically, the non-rectangular potential structure P given to the n-type $Ga_BIn_CN$ active layer 109 is a structure in which the conduction band end CB is substantially flat on the junction interface 119 side with the upper end layer 106 of the super lattice structure 104 and inclines from the Fermi level F toward in the far direction uniformly, and drops extremely toward the Fermi level F at the region in the vicinity of the junction interface 120 with the n-type cladding layer 118, thus forming a potential well P1. On the other hand, the valence band VB rapidly bends toward the Fermi level F at the region in the vicinity of the junction interface 119 with the upper end layer 106. The potential well P1 of the conduction band has a well P1 of a potential sufficient to allow electrons e to localize, which are supplied from the super lattice structure 104 side or exist within the n-type $Ga_BIn_CN$ active layer 109, and it should especially be remembered that this potential well is not due to a drop of a comparatively shallow band resulting from an ordinary notch which is exhibited in the hetero junction interface.

The non-rectangular potential well structure P has a band structure in which the bands on the conduction band end CB side and on the valence band VB are allowed to rapidly bend at the specified regions in the vicinity of the junction interfaces 111 and 120 with the p-type cladding layer 110 and the n-type crystal layer 118, and electrons e or holes h are localized. The non-rectangular potential well structure P has a form different from a symmetrical rectangular potential structure observed in the conventional SQW and MQW structures. Furthermore, the non-rectangular potential well structure P differs from the conventional band structure in which there is no steep drop of a band at a specified region, and the band inclines toward a Fermi level side from a p-type cladding layer to a n-type cladding layer with a certain level, thus lowering its level (see Mat. Res. Soc. Symp. Proc., Vol. 449, 1997, pp. 1167–1172).

A junction structure in which the n-type super lattice structure arranged on the n-type cladding layer side with the n-type $Ga_BIn_CN$ active layer 109 having the non-rectangular potential structure stacked on the upper end layer of the super lattice structure is a principal structure in the first embodiment. If a stacking structure body comprising a light-emitting layer formed of this principal structure is appropriately subjected to treatments to provide ohmic-input and ohmic-output electrodes, a group-III nitride semiconductor light-emitting device according to the present invention can be obtained. In a stacking structure body having a substrate made of conductive silicon carbide (SiC), and a group III–V compound semiconductor crystal such as gallium phosphide (GaP), or made of single crystal silicon (Si), one ohmic electrode can be formed on the back surface of the conductive substrate, and a light-emitting device composed of a simplified structure can profitably be constructed by simplified processes.

In a second embodiment of the present invention, the super lattice structure is formed of a non-quantum well structure obtained by alternately stacking two kinds of layers made of conductive n-type $Al_xGa_yIn_zN$ ($0 \leq X < 1$, $X+Y+Z=1$). Each layer has a thickness ranging from 50 nm to 70 nm capable of suppressing the generation of the quantum effect and the difference of the thickness of the layer is set to be within ±5 nm to remove a functional distinction between the well layer and the barrier layer. Each layer made of n-type $Al_xGa_yIn_zN$ ($0 \leq X < 1$, $X+Y+Z=1$) has a composition ratio of the group-III constituent element different from that of the other. It is advantageous to form the two kinds of layers forming the super lattice structure by two $Al_xGa_yN$ ($0 \leq X < 1$, $X+Y=1$) which have different aluminum composition ratios (=X). Particularly, the super lattice structure adopting the non-quantum structure, which is obtained by a stacking structure composed of GaN and $Al_xGa_yN$ of an aluminum composition ratio exhibiting an off-set of 0.2 eV or less on the conduction band side relative to GaN, is very effective to obtain light with excellent monochromaticity. The distribution coefficient of the difference of the band gap between GaN and AlN to the conduction band side in the hetero junction system composed of GaN and AlN is 0.78 (78%) (see Mat. Res. Soc. Symp. Proc., Vol. 395, 1996, pp. 123–134). Furthermore, if the band gap of AlN at room temperature is set to 5.9 eV (Isamu Akasaki, edi., Group III–V Compound Semiconductor Baifukan Co., Ltd., May 20, 1994, p. 150) and the aluminum composition ratio (=X) of $Al_xGa_yN$ giving an off-set of less than 0.2 eV to GaN on the conduction band side is calculated, the aluminum composition ratio to be obtained by the calculation will be about 0.10 or less. Since in the super lattice structure, the band off-set between the constituent layers should be set to at least 0.1 eV or more, the desirable minimum value of the aluminum composition ratio is about 0.05.

The non-quantum structure does not mean a super lattice structure in which a quantum level is formed in the well layer by serving one constituent layer as a well layer, and the other as a barrier layer. Each of the constituent layers serves neither as the well layer nor as the barrier layer, accordingly, the non-quantum structure means a super lattice structure which does not cause a formation of the quantum level. Use of the group-III nitride semiconductor crystal layers in which the thickness thereof is set to be large as described above suffices to form the non-quantum structure. Particularly, the non-quantum structure should be constructed by group-III nitride semiconductor crystal layers having thicknesses ranging from about 50 nm to 70 nm, which are approximately equal to each other. This is because the super lattice structure of constituent layers having extremely different thicknesses results in ineffective suppression of the crystal defect penetrating from the lower layer, even when the constituent layers of the non-quantum structure are crystal layers having insufficient thicknesses to bring about quantization. Furthermore, strains in the constituent layers are rather caused, due to the difference of the thicknesses of the constituent layers, and crystallinity of the super lattice structure may be degraded. In order to prevent degradation of the crystallinity of the super lattice structure itself, the difference in the thicknesses between the constituent layers should desirably be within ±10 nm, and preferably ±5 nm. If the thickness of one constituent layer is, for example, 55 nm, the thickness of the other constituent layer is set to a range from 50 nm to 60 nm.

Where a super lattice structure formed of a periodic stacking structure which includes stacking structures unit, each of which is composed of $Al_xGa_yN$ ($0.05 \leq X \leq 0.10$, $X+Y=1$) preferably having an aluminum composition ratio (=X) ranging from 0.05 to 0.10 and GaN, is fabricated, a first constituent layer forming the initial layer should be formed of $Al_xGa_yN$ ($0.05 \leq X \leq 0.10$, $X+Y=1$) exhibiting a band gap longer than that of GaN. A second constituent layer should be formed with GaN exhibiting a band gap smaller than that of $Al_xGa_yN$.

If the super lattice structure is made by the non-quantum structure, it is possible to suppress light emission corresponding to a quantum level from the super lattice structure. Thus, an appearance of a subsidiary light emission, which is accompanied with major light emission generated from a substantial light-emitting portion, is prevented, resulting in light with excellent monochromaticity. In addition, a group-III nitride semiconductor crystal layer with excellent crystallinity can be grown above such super lattice structure, a high intensity light emission can advantageously be brought about with use of this crystal layer as a substantial light-emitting layer.

In order to obtain a group-III nitride semiconductor light-emitting device with more excellent monochromaticity, in a third embodiment of the present invention, an active layer is composed of a well layer at the end closer to a p-type cladding layer in the quantum well structure provided on the upper end layer of the foregoing super lattice structure. The quantum well structure is formed from a well layer made of a gallium indium nitride mixed-crystal ($Ga_yIn_zN$: $0.7 \leq Y<1$, $0<Z \leq 0.3$, $Y+Z=1$) having an indium composition ratio of 0.3 or less and a barrier layer made of a gallium indium nitride mixed-crystal ($Ga_BIn_CN$: $Y<B<1$, $0<C<Z$, $B+C=1$) having an indium composition ratio smaller than that of the $Ga_yIn_zN$ mixed-crystal. The quantum-well structure has a stacking cycle number of 5 or less. In forming the quantum well structure, the barrier layer must be made of a material having a band gap larger than that of the well layer (see Reona Esaki edi., *Super Lattice Hetero Structure,* Kogyo Chosakai Co., Ltd., first edition (Sep. 10, 1988), pp. 477–480). The well layer should preferably be made of $Ga_yIn_zN$ capable of readily controlling the wavelength of emitted light in the visible region depending on the indium composition ratio (=Z). This is because when the indium composition ratio is particularly set to 0.3 or less, a crystal layer with excellent crystallinity convenient for obtaining a high intensity light emission can be achieved because of the low indium composition ratio of $Ga_yIn_zN$: $0.7 \leq Y<1$, $0<Z \leq 0.3$, $Y+Z=1$). Accordingly, the barrier layer should preferably be made of, for example, $Ga_BIn_CN$ ($Y<B<1$, $0<C<Z$, $B+C=1$) having a low indium composition ratio.

Where the upper end layer of the super lattice structure is a constituent layer having a band gap smaller than those of other constituent layers of the super lattice structure, the barrier layer forming the quantum well structure should be joined to the upper end layer. On the other hand, in the case where the upper end layer is a constituent layer having a band gap larger than others, the well layer of the quantum well structure should be joined to the upper end layer. When a structure in which the barrier layer having a large band gap is joined to the upper end layer having the band gap larger than those of other constituent layers is employed, a region acting as a current barrier is created at a middle position of the quantum well structure and the super lattice structure, leading to an increase in conduction resistance disadvantageously.

The quantum well structure is fabricated by a stacking unit structure composed of the barrier layer and the well layer by five periods at a maximum. As the stacking cycle number increases, the flatness of the surfaces of the well layer and the barrier layer is increasingly degraded. Usually, in a well layer having a thickness of about 10 nm or less, when the step difference of the surface of the deposited layer is particularly as large as several nm, far exceeding an atomic step difference, the well layer varies and a significant displacement in the quantum level occurs. For example, when the step difference of the surface of the deposited layer is as large as 5 nm depending on a region of the deposited layer in desiring a well layer having a width of 10 nm, the magnitude of variation of the step difference relative to the desired width of the well layer becomes as large as 50%. In homogeneity of the width of the well layer causes a variation large enough to make the resulting quantum level uneven. Accordingly, the well layer exhibiting different levels depending on regions is disadvantageously created. To increase uselessly the stacking cycle number of the structure unit then results in formations of various quantum levels. The difference of the quantum levels appears as a difference of emission wavelength. Therefore, to increase the stacking cycle number of the structure unit uselessly is not preferable. The stacking cycle number of the structure unit forming the quantum well structure should be about 10 or less, and more preferably to be 5 or less. Light with excellent monochromaticity, which has a half width at half maximum (FWHM) of about 10 nm or less, in the blue light emission spectrum, can be obtained from the quantum well structure in which a stacking cycle number of is 5 or less.

To prevent a degradation of the monochromaticity accompanied with an increase of the foregoing stacking cycle number of the structure unit, an active layer is made of a single gallium indium nitride mixed-crystal layer directly joined to an upper end layer of the foregoing super lattice structure in the fourth embodiment. Since a structure which has no well layers coexisting therein is adopted in the fourth embodiment, unlike the quantum well structure formed of the foregoing periodic structure, a wavelength of a light emitted is mainly determined by band transition energy of the active layer only. For example, the half width at half maximum (FWHM) can be set to about less than 10 nm concerning spectrum having a central emission wavelength of about 450 nm. In another example, a green spectrum having a central emission wavelength of about 525 nm and a half width at half maximum of about less than 20 nm can be obtained in a stable manner.

If the active layer is directly joined to the upper end layer of the super lattice structure, a structure according to the fourth embodiment can be obtained. If the active layer is formed of a crystal layer having the above described non-rectangular bent band structure, a light-emitting layer which emits no subsidiary light around the major emission spectrum and has excellent monochromaticity can be formed. In addition, the light-emitting layer which provides a longer emission wavelength can be obtained.

When the active layer that is an actual light-emitting layer is made of a gallium indium nitride crystal, visible light can be advantageously achieved due to its appropriate band gap. Particularly, in a fifth embodiment of the present invention, the active layer is made of a gallium indium nitride mixed-crystal of a multi-phase structure which is composed of a plurality of $Ga\alpha In\beta N$ ($0 \leq \alpha<1$, $\alpha+\beta=1$) crystal phases, each crystal phase having a different indium composition ratio (=β) from others. Specifically, the multi-phase structure is a texture composed of the plurality of $Ga\alpha In\beta N$ ($0 \leq \alpha<1$, $\alpha+\beta=1$) crystal phases, each crystal phase having a different indium composition ratio (=β) from others. In the crystal layer made of $Ga_yIn_zN$, a phase occupying a large region (volume) is tentatively called a matrix phase, a texture in which a microcrystalline substance made of $Ga\alpha In\beta N$ ($0 \leq \alpha<1$, $\alpha+\beta=1$) subordinately exists in the matrix phase is an example for appropriately explaining the multi-phase. A sub-phase and the matrix phase have usually different indium composition ratios. The indium concentration of the matrix phase is as low as $1 \times 10^{20}$ cm$^{-3}$ or less, and sometimes is regarded substantially as GaN. Usually, the matrix phase is formed mainly of a layered single crystal.

The sub-phase and the matrix phase have usually different indium composition ratios. Furthermore, the indium composition ratio differs also among the sub-phases. When nonhomogeneity of the difference between the matrix phase and the sub-phase is as large as about several tens of percent, especially exceeds about 50%, disadvantageous degradation in emission light monochromaticity occurs. Accordingly, the difference of the indium composition ratios between the matrix phase and the sub-phase should be less than ±30%, and more preferably within ±15%. To hold the difference of the indium composition ratio within a preferable range, optimization of growth conditions of a crystal layer made of $Ga_yIn_zN$, especially optimization of a heating and holding time under high temperature growth conditions, and of temperature elevation and lowering rates in heating and cooling operations are effective. Under the optimized growth conditions, effects in which uniformalization of sizes of the $Ga\alpha In\beta N$ sub-phase taking usually spherical, semi-spherical and island shapes is also promoted.

In a structure in which the active layer of the multi-phase structure is deposited either on the upper end layer of the super lattice structure, or on the barrier layer of the quantum well structure, as the "deposited layer", particularly, in a sixth embodiment, the active layer is composed of a matrix phase made of an n-type group-III nitride semiconductor crystal having the same composition as an n-type group-III nitride semiconductor, which forms the "deposited layer", and of a sub-phase made of a $Ga\alpha In\beta N$ crystal different from the matrix phase in its indium composition ratio. In other words, the matrix phase is mainly made of the n-type group-III nitride semiconductor crystal forming the deposited layer. If the matrix phase occupying a large part of the region within the $Ga_yIn_zN$ active layer is made in the foregoing manner, it is possible to maintain a superior lattice matching with the upper end layer of the super lattice structure. By this lattice matching structure, the crystallinity of the $Ga_yIn_zN$ active layer is significantly improved. Describing the degree of improvement in the crystallinity from a dislocation density as an example, while the dislocation density in the prior art is 2 to $10 \times 10^{10}$ cm$^{-2}$ (see *Appl. Phys. Lett.*, 66, 1995, 1249) the dislocation density can easily be reduced to $1 \times 10^8$ cm$^{-2}$ in the structure of this embodiment of the present invention. Thus, a high intensity light emission can be obtained, resulting in a nitride semiconductor light-emitting device with a high light emission intensity. Particularly, the multi-phase structure crystal layer involving strains in a junction region of the matrix phase and the sub-phase exhibits an effect to increase a light emission intensity.

Describing again, in the seventh and eighth embodiments, the active layer is formed of a $Ga\alpha In\beta N$ crystal layer including a non-rectangular potential structure which has bending in conduction and valence bands in the specified region in the vicinity of the junction interface with the p-type cladding layer. This active layer has a clear difference in band structure from the conventional band structure which maintains a rectangular potential structure even when strain due to junction formation with either the p-type cladding layer or the barrier layer forming the quantum well structure is applied (see Japanese Unexamined Patent Publication No. H10-126006).

The presence of a non-rectangular potential structure within the active layer cannot be achieved sufficiently only by joining the active layer to a group-III nitride semiconductor layer having a thermal expansion coefficient different from that of the active layer as disclosed in the prior art (see Japanese Unexamined Patent Publication No. H8-316528). Abrupt composition change must inevitably be achieved sufficiently at the junction interface of the active layer and the crystal layer joined thereto sufficiently. If the composition is not sharply changed within the transition region width corresponding to the thickness equivalent to that of the several lattice layers, the non-rectangular potential structure of the present invention cannot be realized stably. This results only in a very common rectangular potential structure having a flat potential bottom as is disclosed in a prior art. When a required sharpness is expressed based on a concentration distribution of group-III constituent elements at the junction interface, it is necessary to reduce the transition distance to about less than 20 nm, most preferably about 15 nm or less, which is required for either decreasing or increasing the average atomic concentration in a mother layer by two figures.

A significant feature achieved from the non-rectangular potential structure of the present invention is that the wavelength of light emitted can readily be alternated by changing a simple mechanical specification. For example of the active layer made of $Ga_yIn_zN$, it is possible to alternate a short emission wavelength to a longer wavelength by a simple operation for reducing the thickness of the active layer, even when the indium composition ratios (=Z) are held to be approximately equal. For example, in the light-emitting portion including the active layer made from n-type $Ga_{0.88}In_{0.12}N$ having an indium composition ratio of about 0.12 and a thickness of about 8 nm, which gives a blue light emission of a wavelength of about 440 nm, by reducing the thickness active layer to about 5 nm. The emission wavelength can be changed to about 470 nm to 480 nm. This is because the decreases in the potentials of the conduction and valence bands in the active layer become deeper by reducing the thickness of the active layer, and transition energy between electrons and holes localized in the potential well then reduces. Furthermore, when the thickness of the active layer is reduced to 3 nm, its wavelength exceeds about 500 nm. As the thickness of the active layer is reduced, bending of the band of the conduction and valence banding at the junction interface becomes further significant, so that the transition energy is considered to be more reduced.

To make the bending of the band more secure, in the eighth embodiment, a structure is adopted in which an $Al_xGa_yN$ ($0 \leq X$, $Y \leq 1$, $X+Y=1$) crystal layer is interposed between the active layer and the p-type cladding layer. The $Al_xGa_yN$ crystal layer differs from arrangement of a spacer layer in TEGFET, and is arranged so as to join to the p-type group-III nitride semiconductor crystal layer. Specifically, the $Al_xGa_yN$ crystal layer is arranged as a space-isolation-layer for spatially separating the active layer and the p-type cladding layer for preventing an inversion of the active layer to a p-type layer owing to diffusion of p-type impurities from the p-type cladding layer. Since the $Al_xGa_yN$ crystal layer is provided actually so as to join with the p-type cladding layer doped with p-type impurities such as magnesium (Mg), group-II impurities in the upper cladding layer are diffused into the $Al_xGa_yN$ crystal layer. Specifically, p-type impurities are always present unintentionally in the $Al_xGa_yN$ crystal layer. Under such situations, the conductivity type of the $Al_xGa_yN$ crystal layer remains n-type. This is because the n-type $Al_xGa_yN$ crystal layer can effectively create the bending of its band structure toward the conduction band in the region near the junction interface with the active layer. The n-type $Al_xGa_yN$ crystal layer should preferably be made of n-type $Al_xGa_yN$ of a carrier concentration of $1 \times 10^{17}$ cm$^{-3}$, which exhibits high resistance and purity. The thickness of the $Al_xGa_yN$ crystal layer should not exceed about 100 nm, and it should be set to a small thickness of about less than 10 nm to achieve a tunnel effect to suppress an increase in an current-flowing resistance.

Furthermore, the seventh and the eighth embodiments have a feature that the active layer is made of $Ga_yIn_zN$ ($0.7 \leq Y < 1$, $0 < Z \leq 0.3$, $Y+Z=1$) having an indium composition ratio of 0.3 or less. This is because $Ga_yIn_zN$ having an indium composition ratio (=Z) controlled to 0.3 or less has excellent crystal quality, thus forming an active layer emitting light with higher intensity.

The super lattice structure of the first embodiment of the present invention has a function to enhance the crystallinity of the active layer that is a substantial light-emitting layer deposited thereon. Furthermore, the active layer formed of the non-rectangular potential structure operates as a light-emitting layer capable of alternating readily in emission wavelength.

The super lattice structure adopting the non-quantum well structure in the second embodiment functions to suppress a light emission produced from various quantum levels which disturbs the monochromaticity of the light emitted, thus emitting light with excellent monochromaticity in addition to enhancement of the crystal quality of the active layer.

The quantum well structure of the third embodiment of the present invention, in which the stacking cycle number of the structure unit is limited to 5 or less, functions to suppress unnecessary and subsidiary light emission accompanied with main light emission, thereby bringing about a light emission with excellent monochromaticity. Furthermore, the active layer the fourth embodiment of the present invention, which has a non-rectangular potential structure in which the gallium indium nitride mixed-crystal is directly joined to the upper end layer forming the super lattice structure, functions to further enhance the monochromaticity of light emission.

The active layer of the fifth embodiment of the present invention, which uses a multi-phase structure composed of the plurality of crystal phases having different indium composition ratios, functions to increase the intensity of light emission. Moreover, the active layer of the sixth embodiment of the present invention, which takes the multi-phase structure including the matrix phase mainly formed of the group-III nitride semiconductor layer of the same composition as the group-III nitride semiconductor layer forming the deposited layer, functions to bring about light emission with excellent intensity.

The non-rectangular potential structure of the seventh embodiment of the present invention, which includes the bending of conduction or valence band, functions to accumulate electrons or holes in the specified low potential region within the active layer, and functions to bring about a light emission of a wavelength longer than that which corresponds to the inherent band gap of the group-III nitride semiconductor forming the active layer. Particularly, the junction structure of the eighth embodiment of the present invention, which is formed by joining the active layer to the n-type $Al_xGa_yN$ crystal layer provided between the active layer and the p-type cladding layer, functions to effectively localize electrons in the potential well portion in the active layer.

EXAMPLES

The following examples are given to further illustrate the present invention but the present invention should not be construed as being limited to these examples.

Example 1

Figure 2:
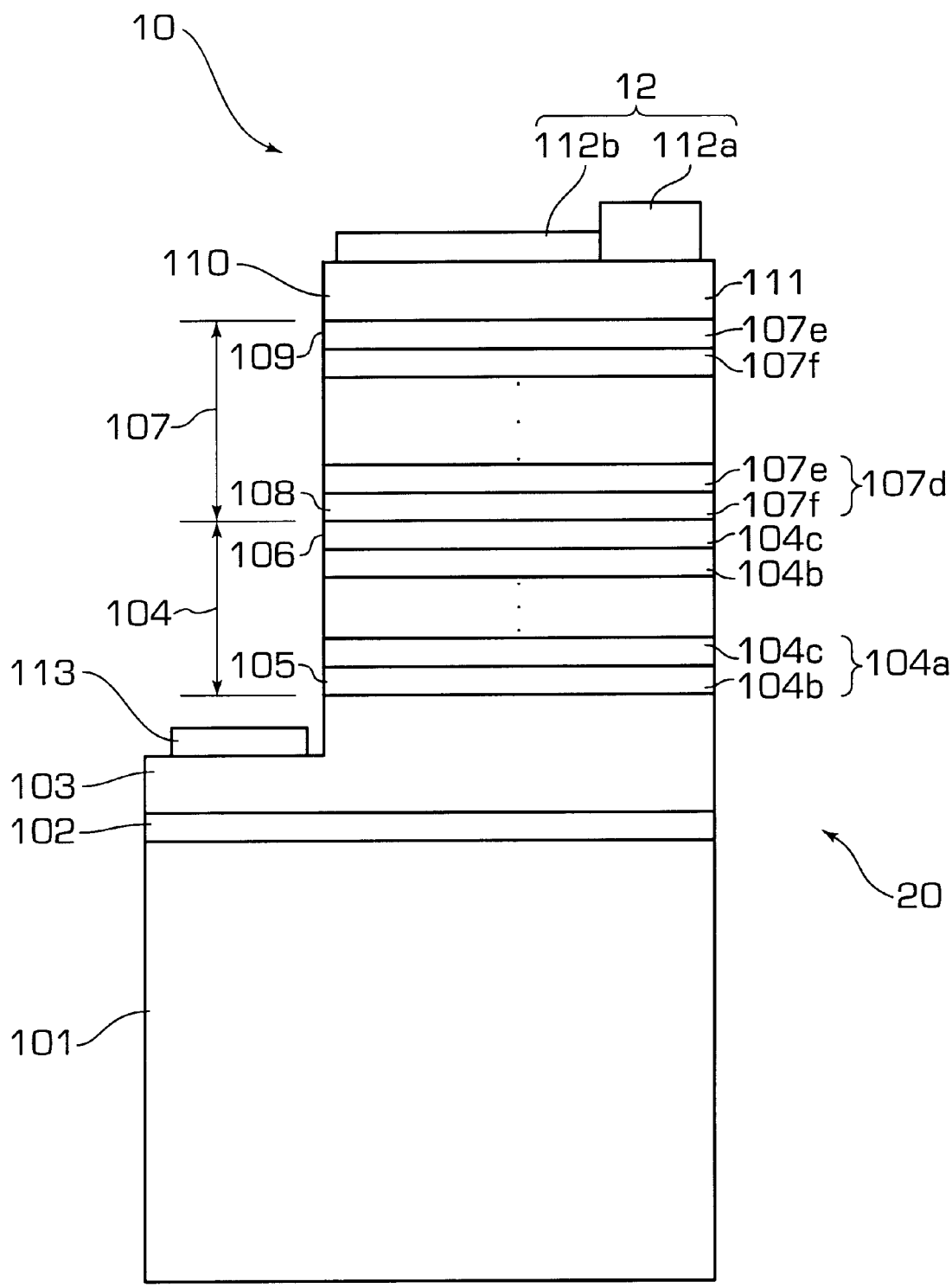
FIG. 2 is a schematic sectional view taken along the line A-A' of the LED of FIG. 1.

The present invention will be concretely described through an example of a fabrication of an LED comprising the forms of the embodiments 1 to 3 according to claims 1 to 3 of the present invention. A plan view of an LED 10 composed of a stacked structure body 20 fabricated in Example 1 is schematically shown in FIG. 1. FIG. 2 shows a schematic sectional view of a central portion of the LED 10 taken along the broken line A-A' of FIG. 1.

The stacking structure body 20 is formed using a sapphire ($\alpha$-$Al_2O_3$ single crystal) as a substrate 101. A buffer layer 102 made of undoped GaN was deposited on the (0001) plane of the sapphire substrate 101. On the GaN buffer layer 102, deposited was a lower cladding layer 103 made of n-type GaN having a doping concentration of silicon (Si) which gradually increases from its junction interface with the buffer layer 102 in its growth direction. The thickness of the lower cladding layer 103 was set to 3 $\mu$m and a carrier concentration at the surface portion of the layer 103 was set to about $3\times10^{18}$ $cm^{-3}$.

A super lattice structure 104 formed on the lower cladding layer 103 in such manner that first and second constituent layers 104b and 104c were stacked repeatably for 12 cycles. The first constituent layer 104b was made of a Si-doped n-type $Al_{0.10}Ga_{0.90}N$ layer having an Al composition ratio of 0.10. The second constituent layer 104c was made of a Si-doped n-type GaN layer having an Al composition ratio of 0. Carrier concentrations of the n-type $Al_{0.10}Ga_{0.90}N$ layer 104b and the n-type GaN layer 104c composing the super lattice structure 104 were adjusted to about $2\times10^{18}$ $cm^{-3}$. The thicknesses of the layers 104b and 104c were both set to 52 nm, and the difference of the thicknesses between the layers 104b and 104c was controlled to a range of ±3 nm. The super lattice structure 104 composed of the layers stacked by 12 cycles was formed by the n-type $Al_{0.10}Ga_{0.90}N$ layer 104b which has a band gap of about 0.25 eV larger than that of a lower GaN cladding layer 103 as an initial layer 105, and the n-type GaN layer 104c as an upper end layer 106 forming a upper surface layer.

On the upper end layer 106, deposited were a quantum well structure 107 formed by a stacked structure unit 107d by 5 cycles, which is composed of an undoped n-type $In_{0.10}Ga_{0.90}N$ layer 107e having an In composition ratio of 0.10 and an undoped n-type GaN layer 107f. The carrier concentration of the n-type $In_{0.10}Ga_{0.90}N$ layer 107e forming the quantum well structure 107 was set to about $6\times10^{17}$ $cm^{-3}$. The carrier concentration of the n-type GaN layer 107f was set to about $2\times10^{17}$ $cm^{-3}$. The thickness of the n-type $In_{0.10}Ga_{0.90}N$ layer 107e forming a well layer was set to 10 nm. The thickness of the n-type GaN layer 107f forming a barrier layer was set to about 20 nm. The quantum well structure 107 composed of the layers stacked by 5 periodic cycles consists of the n-type GaN layer 107f as an initial layer 108 and the n-type $In_{0.10}Ga_{0.90}N$ layer 107e as an active layer 109 serving as a substantial light-emitting layer, located on a p-type cladding layer side of the quantum well structure.

A p-type $Al_xGa_yN$ layer (X=0.15→0) which was doped with Mg and had a thickness of 300 nm and a carrier concentration of $2\times10^{17}$ $cm^{-3}$ was joined onto the active layer 109 made of the n-type $In_{0.10}Ga_{0.90}N$ 107e as an end layer of the quantum well structure 107. The Al composition ratio X of the p-type $Al_xGa_yN$ layer 110 was reduced from the junction interface with the upper end layer 109 in increasing direction of the thickness, and the Al composition ratio X became zero at the surface portion, that is, the p-type $Al_xGa_yN$ layer 110 became a p-type GaN.

Each of the constituent layers of the stacking structure body 20 deposited on the surface of the sapphire substrate 101 was grown using a general atmospheric pressure MOCVD growth technique. In the growth of the active layer 109 and the p-type cladding layer 110, a method to achieve sharpness of the junction interface 111 was employed. That is, to secure the composition abruptness of aluminum and indium in the junction interface 111, introduction of source materials of a group-III constituent elements into an MOCVD reaction system was once stopped after completion of the growth of the active layer 109 of the quantum well structure 107. In other words, after the growth of the n-type $In_{0.10}Ga_{0.90}N$ 107e layer was completed by stopping the supply of the gallium and indium sources into the MOCVD reaction system, an interval time of 5 minutes was provided until growth of the p-type cladding layer 110 was begun. Alter passage of this interval time, aluminum and gallium source materials were introduced into a MOCVD reactor, and thus the junction interface 111 was sharpened. It was shown from a general SIMS analysis in a depth direction that a transition region width required for an aluminum atom concentration to change from $1\times10^{19}$ cm$^{-3}$ to $1\times10^{21}$ cm$^{-3}$ was about 12 mm.

The stacking structure body 20 was subjected to device (chip) processes using a patterning technique by a general photolithography procedure and a plasma etching procedure using argon (Ar)/methane ($CH_4$)/hydrogen ($H_2$) mixed gas, and thus forming LED 10. A p-type ohmic electrode 112 for forming the LED 10 is composed of a pad electrode 112a adopting a two layer structure and a transparent electrode 112b formed of a conductive titanium nitride (TiN) thin film. The lower side of the stage electrode 112a, which contacts the surface of the p-type cladding layer 110 formed of a Mg-doped $Al_xGa_yN$ composition gradient layer, was made of gold-zinc alloy (Au: 95 weight %, Zn: 5 weight %), and the upper layer of the pad electrode 112a was made of Au. An n-type ohmic electrode 113 was formed so as to contact the surface of the lower cladding layer 103, after the upper portion of which was removed by plasma etching. The n-type ohmic pad electrode 113 was made of aluminum.

Figure 3:
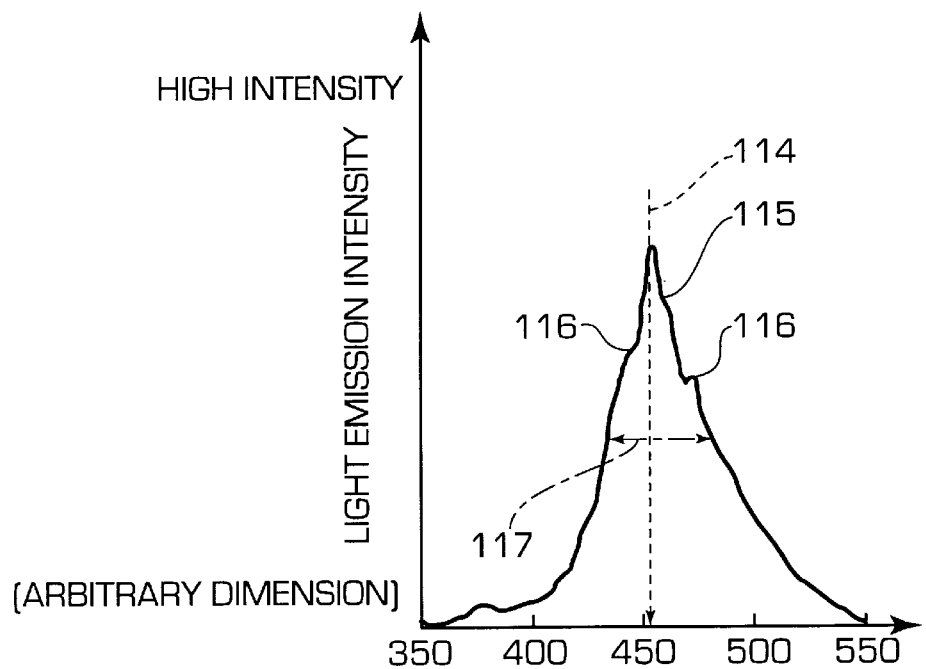
FIG. 3 is a drawing showing the light-emitting spectrum of the LED of Example 1.

When an operation current of 20 mA was passed across both electrodes of the LED 10 in a forward direction, a blue light having a central emission wavelength of 454 nm at which a maximum light emission intensity resulted was radiated as shown in FIG. 3. Moreover, it was recognized that subsidiary spectrum 116 accompanied with light emission spectrum 115 emerged on both sides of the main spectrum 115 as shown in FIG. 3. However, a half width 117 of the spectrum was not so degraded due to the adjacency of subsidiary spectrum 116, and was about 7 nm. Furthermore, light emission intensity measured by a general integrating sphere was very excellent to reach a magnitude of about 20 $\mu$W in the chip state.

It should be noted that a band gap giving a central wavelength (454 nm) of light emitted is theoretically 2.72 eV according to light quantum theory. An inherent band gap of the n-type $In_{0.10}Ga_{0.90}N$ 107e, which forms a well layer at the end of the p-type cladding layer of the quantum well structure 107 as well as the active layer 109, is about 3.2 eV at room temperature (see Japanese Examined Patent Publication No. S55-3834). The wavelength of light corresponding to this is about 388 nm. Specifically, as recited in this example, it was assumed that the hetero junction structure formed so as to enhance the abruptness of the composition at the junction interface 111 of the active layer 109 and the p-type cladding layer 110 of the quantum well structure 107 realized a non-rectangular potential structure which sufficiently reduced transition energy by about 0.47 eV compared to the inherent band gap (=3.2 eV).

Furthermore, if the high speed response of light emission is represented by the pulse voltage response of light emission, the time from application of the pulse voltage of +5 V to the foregoing blue light emission with a stable intensity was measured to be about 18 ps, resulting in an LED with excellent response.

Comparative Example

In the LED 10 described in foregoing Example 1, after the growth of the n-type $In_{0.10}Ga_{0.90}N$ 107e forming the active layer 109 that is the final end of the quantum well structure 107 without provision of the period for interrupting the growth as in Example 1, the process proceeded to grow the p-type cladding layer 110 continuously. In other words, a stacking structure having a quantum structure of a general rectangular potential structure which did not achieve the sharpness of the junction interface 111 was constructed. This stacking structure was processed for making a device as in Example 1, thus an LED was obtained.

Figure 4:
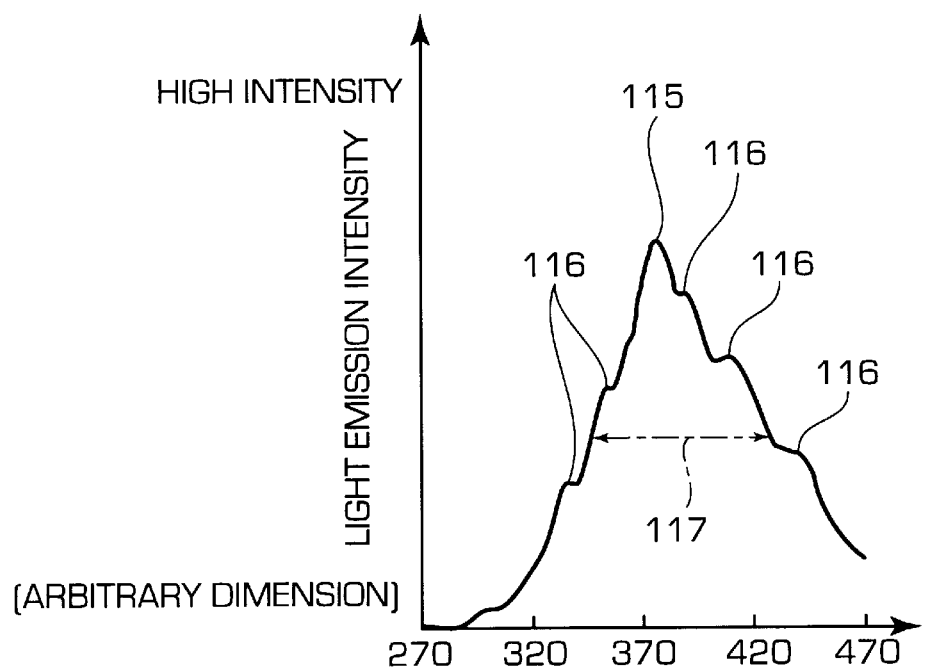
FIG. 4 is a drawing showing the light-emitting spectrum of an LED of Comparative Example.

The light emission characteristic of this LED was compared with that of the conventional LED. As is exemplified in FIG. 4, the central wavelength 114 of the main emission spectrum 115 at a forward current of 20 mA was 372 nm, and was notably shorter that that of an emitted light corresponding to the inherent band gap of n-type $In_{0.10}Ga_{0.90}N$ which forms the active layer. In other words, in the LED of this Comparative Example, the non-rectangular potential well was not formed at a specified position within the well layer 107e at the end on the p-type cladding layer side of the quantum well structure 107, and the foregoing light emission characteristic was considered to be an emission which can be principally explained from a simple rectangular potential well structure including the foregoing well structure 107e.

Furthermore, around the main emission spectrum 115, a plurality of subsidiary emission spectrum 116 emerged substantially periodically. For this reason, the half width 117 of the spectrum widened, resulting in light emission with poor monochromaticity. The subsidiary spectrum which occurred substantially periodically was recognized as a satellite light emission from the rectangular potential well structure, and considering the phenomenon that the wavelength of the foregoing light emitted was shorter than the wavelength corresponding to the band gap of the material, it was concluded that the LED of this comparative example is an LED comprising the quantum well structure of a conventional general rectangular potential structure. In a chip state, the emission intensity measured by a general integrating sphere was about 11 $\mu$W.

As is specifically shown by the comparison of the light emission characteristic of the LED of the foregoing Comparative Example with Example 1, the LED according to the present invention was obviously superior to the LED of Comparative Example in emission intensity and monochromaticity. This is because the active layer of the quantum well structure of the LED according to Example 1 of the present invention comprises a non-rectangular potential structure which is rational for emitting light of a wavelength longer than that corresponding to the band gap of its constituent material. In order to achieve not only the rectangular potential structure which merely gives a light of a wavelength shorter than that of a light corresponding to the inherent band gap but also the non-rectangular potential structure according to the present invention, it is very important to achieve sharpness at the junction interface of the active layer and the p-type cladding layer made of the p-type group-III nitride semiconductor as described above. In other words, the abruptness of the composition at the junction interface is indispensable technical factor for achieving a non-rectangular potential structure capable of enhancing emission intensity and monochromaticity.

Example 2

The present invention will be described specifically using the case where an LED 40 was constructed using a stacking structure body 50, as in embodiment 4.

Figure 5:
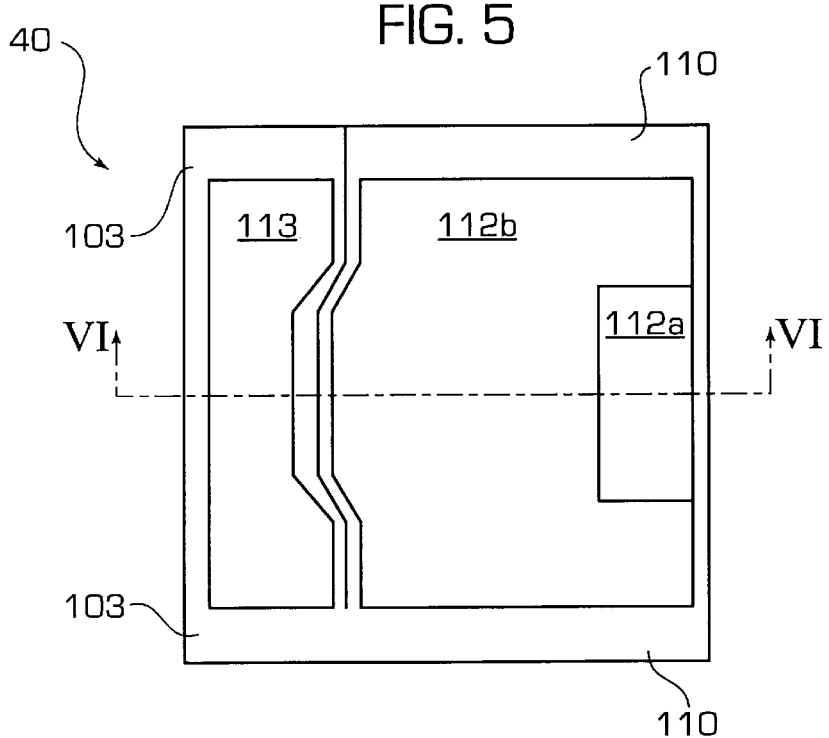
FIG. 5 is a schematic plan view of an LED according to Example 2 of the present invention.
Figure 6:
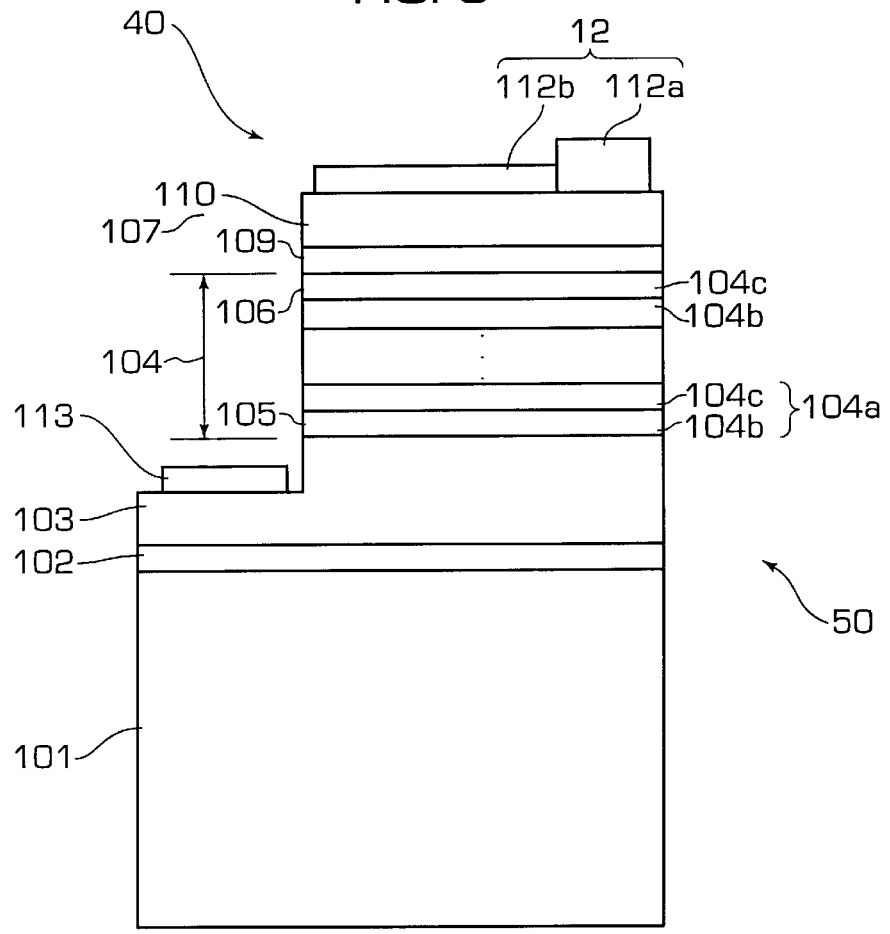
FIG. 6 is a schematic sectional view taken along the line B-B' of the LED of FIG. 5.

FIG. 5 is a schematic plan view of the LED 40 fabricated in this example. FIG. 6 is a schematic sectional view taken along the broken line B-B' in the schematic plan view of FIG. 5.

A mixed-crystal layer composed of a single layer which was the same n-type $In_{0.10}Ga_{0.90}N$ as that used as the well layer 107e of the quantum well structure 107 in Example 1 was provided as the only crystal layer, so as to directly join onto the n-type GaN layer forming the upper end layer 106 of the super lattice structure 104 described in Example 1. According to observation by a general section TEM technique, the dislocation density within the active layer 109 was measured to be about $10^6$ $cm^{-2}$.

The $Al_xGa_yN$ crystal layer described in Example 1, which served as the p-type cladding layer 110 in which a gradient of an aluminum composition was provided, was joined onto the active layer 109 after the interruption of the growth for making the junction interface sharp. In other words, in this example, a structure, in which the only active layer 109 was stacked onto the upper end layer 106 of the super lattice structure 104, was adopted.

Figure 7:
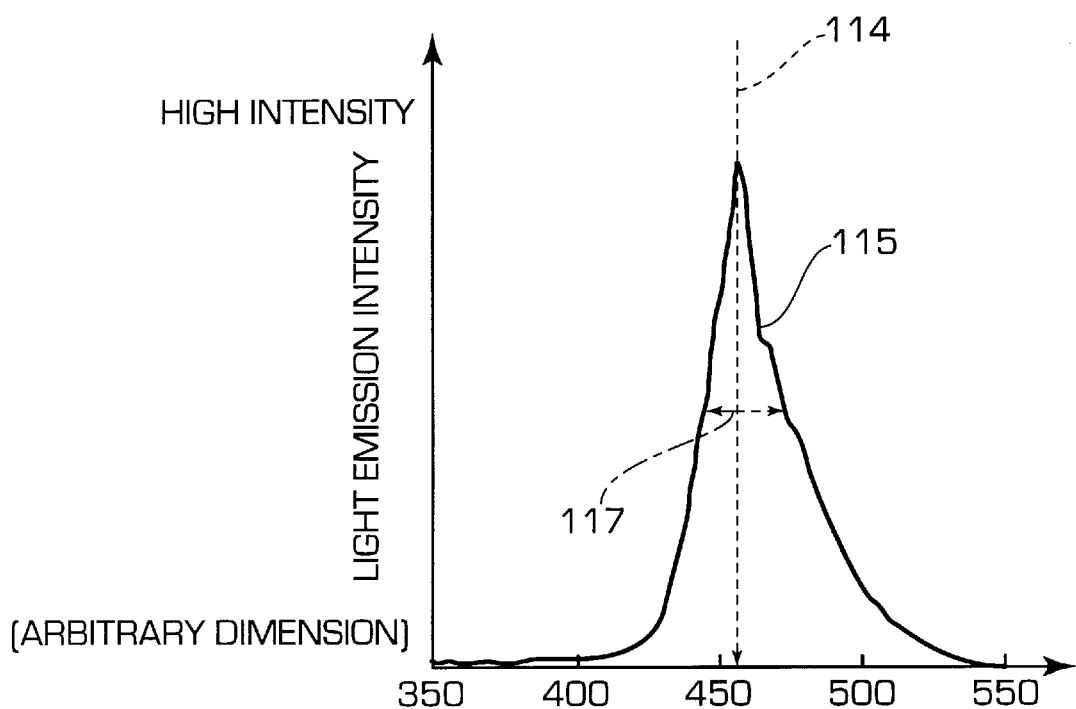
FIG. 7 is a drawing showing the light-emitting spectrum of the LED of Example 2.

Using the foregoing laminated structure 50, an operation current of 20 mA was passed in a forward direction across the LED 40 fabricated in the same manner as Example 1, and blue light exhibiting the spectrum as shown in FIG. 7 was emitted. The central wavelength 114 of the emitted light producing the maximum emission intensity was 458 nm approximately the same as that of the LED 10 of Example 1. Furthermore, the subsidiary spectrum was substantially not generated with the main emission spectrum 115. The reason why generation of subsidiary spectrum is suppressed compared to the case of Example 1 is that a layer having the potential well structure is limited to only the one layer of the active layer 109. The half width 117 of the spectrum was as good as about 6 nm. The intensity of the emitted light measured by a general integrating sphere was about 21 $\mu$W. By the way, the intensity of emitted light by the LED fabricated by directly depositing the active layer 109 on the GaN lower cladding layer 103 while omitting the foregoing super lattice structure 104 was as low as about 10 $\mu$W equivalent to about ½ that of this example, reflecting a magnitude of dislocation density exceeding about $1\times10^{10}$ $cm^{-2}$ of the active layer 109.

When the characteristics of the LEDs 10 and 40 of Examples 1 and 2 were compared, lights which have approximately the same wavelength and intensity were emitted from the LEDs 10 and 40. This suggested that the emission intensity obtained greatly depended on an improvement of crystallinity of the active layer by interposing the super lattice structure therebetween and it did not depend substantially on the number of the potential wells existing within the stacking structure. This expressed that the wavelength of the emitted light was determined mainly by the active layer of the stacking structure. The stacking structure comprising the active layer composed of the single layer gave a characteristic with more excellent monochromaticity of the emitted light.

Example 3

The present invention will be described specifically using another case where an LED 70 was constructed by a stacking structure 80, as described in embodiment 4.

Figure 8:
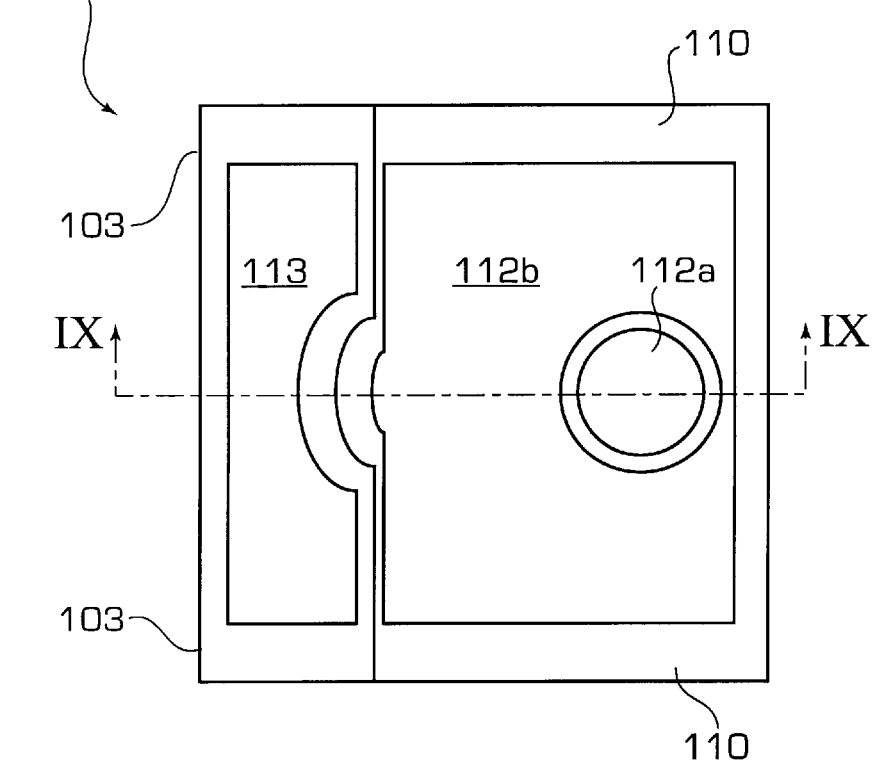
FIG. 8 is a schematic plan view of an LED according to Example 3 of the present invention.
Figure 9:
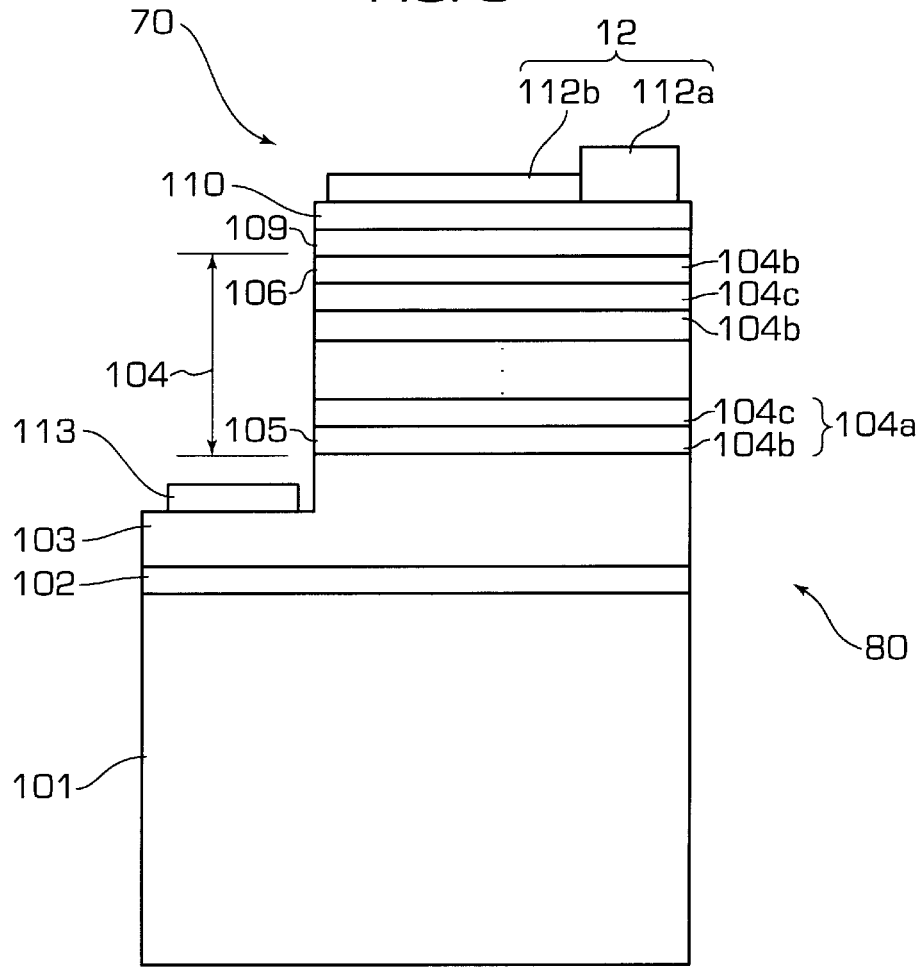
FIG. 9 is a schematic sectional view taken along the line C-C' of the LED of FIG. 8.

FIG. 8 is a schematic plan view of the LED 70 fabricated in this example, and FIG. 9 is a schematic sectional view taken along the broken line C-C' shown in the schematic plan view of FIG. 8.

A GaN buffer layer 102 formed of the same structure as that of Example 1 and a lower cladding layer 103 made of an n-type GaN having a gradient of a carrier concentration were sequentially deposited on a c-crystal plane of a sapphire single crystal 101. Next, a super lattice structure 104 was deposited on the lower cladding layer 103. A first constituent layer 104b composing the super lattice structure 104 was made of a Si-doped n-type $Al_{0.05}Ga_{0.95}N$ layer having an Al composition ratio of 0.05, and a second constituent layer 104c composing the super lattice structure 104 was made of a Si-doped n-type GaN layer. The super lattice structure 104 was formed in a manner that a stacking structure unit 104a composed of a pair of first and second constituent layers 104b and 104c was periodically stacked by 10 cycles. In this example, a structure in which the n-type $Al_{0.05}Ga_{0.95}N$ layer that was the first constituent layer 104b was further placed on the upper most layer of the 10-cycle stacking structure. The carrier concentrations of the n-type $Al_{0.05}Ga_{0.95}N$ layer 104b and the n-type GaN layer 104c forming the super lattice structure 104 were set to about $3\times10^{18}$ $cm^{-3}$. The thicknesses of both layers 104b and 104c were set to 58 nm, and the difference in the thickness between both layers 104b and 104c was kept below 4 nm. The super lattice structure 104 composed of the layers stacked by 10 cycles had a form in which the n-type $Al_{0.05}Ga_{0.95}N$ layer 104b having a band gap larger than that of the GaN layer forming the lower cladding layer 103 by about 0.13 eV was used as an initial layer 105 and an upper end layer 106.

The only active layer 109 made of an undoped n-type $In_{0.20}Ga_{0.80}N$ layer having an In composition ratio of 0.20, which is a substantial light-emitting layer, was deposited on the upper end layer 106. The carrier concentration of the active layer in which a non-rectangular potential structure arose was set to about $1\times10^{18}$ $cm^{-3}$, and the thickness thereof was set to 12 nm.

After provision of the interruption period of growth to achieve the abruptness of the junction interface with the adjacent layer similarly to Example 1, a Mg-doped p-type $Al_xGa_yN$ layer (X=0.15→0) 110 having a thickness of 300 nm and a carrier concentration of $2\times10^{17}$ $cm^{-3}$, in which the aluminum composition ratio was a gradient, was joined onto the active layer 109 made of n-type $In_{0.20}Ga_{0.80}N$. The Al composition ratio was gradually reduced from the junction interface with the active layer 109 in the direction of the thickness increase, and became zero, i.e., p-GaN, at the surface portion of the p-$Al_xGa_yN$ layer 110.

After the stacking structure 80 was processed similarly to Example 1, a p-type ohmic electrode 112 and an n-type ohmic electrode 113 described in Example 1 were provided, thus fabricating LED 70. When an operation current of 20 mA was passed across both of the electrodes of the LED 70 in a forward direction, a bluish green light having a central wavelength of 476 nm at which the maximum emission intensity was created was radiated. The situation was achieved where subsidiary spectrum accompanied with main emission spectrum did not substantially occur. The reason why the occurrence of the subsidiary spectrum was controlled was that a layer having the potential well was limited to the only active layer 109 compared with the case of Example 1. The half width of the spectrum was excellent at about 8 nm. Furthermore, the emission intensity measured by a general integrating sphere reached a magnitude of about 22 $\mu$W in a chip state which was excellent.

The LED of this example had the feature that contrary to a band gap of n-type $In_{0.20}Ga_{0.80}N$ forming the active layer 109 that is a light-emitting layer is about 3.1 eV, the generated light had a wavelength longer than that (=400 nm) corresponding to this band gap. Light having such a long wavelength cannot be radiated from the quantum well layer of the conventional rectangular potential structure in principle, and this light of a long wavelength can be radiated by only the non-rectangular potential structure of the present invention, which created a reduction of transition energy. The transition energy in the hetero junction structure composed of the active layer 109 and the p-type cladding layer 110 were estimated to be about 2.6 eV.

Furthermore, the LED described in Example 3 predicted that a light-emitting device capable of emitting a short-wavelength visible light with a strong emission intensity and excellent monochromaticity can be obtained in spite that only one layer of the group-III nitride semiconductor layer was used for the light-emitting active layer. Particularly as to the monochromaticity of the emitted light, the LED of this example was superior to that formed by the structure having the quantum well structure.

Example 4

In the description of Example 4, the present invention will be described using a case where an LED was fabricated by a stacking structure comprising an active layer formed according to the fifth embodiment.

In Example 4, in forming an LED from the stacking structure formed by the structure described in Example 2, only an active layer was made of n-type $Ga_{0.90}In_{0.10}N$ significantly recognized as a multi-phase structure, which was different from Example 2 in its form.

A stacking structure comprising the active layer made of n-type $Ga_{0.90}In_{0.10}N$ adopting the multi-phase structure according to Example 4 was fabricated in a manner that an active layer made of n-type $Ga_{0.90}In_{0.10}N$ was grown on an upper end layer of a super lattice structure similarly to Example 2. A p-type $Al_xGa_yN$ composition gradient layer serving as a p-type cladding layer as well as a contact layer was grown at 1050° C. similarly to Example 2 after adoption of a measure of growth interruption to create sharpness at the junction interface, and then a gradual cooling method was adopted. The gradual cooling method was cooling procedures comprising a first cooling step for performing a cooling operation at a rate of 45° C. per minute for cooling from 1050° C. to 950° C., and a second cooling step for performing a cooling operation at a rate of 15° C. per minute from 950 to 650° C.

Figure 10:
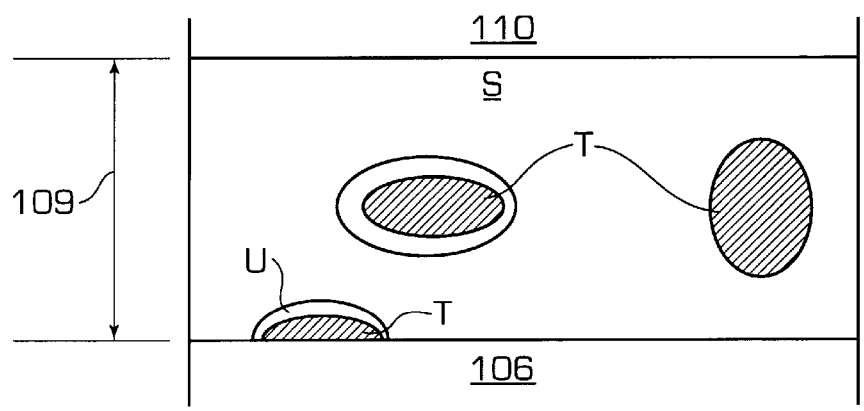
FIG. 10 is a drawing showing the internal structure of an active layer according to Example 4 of the present invention.

By these cooling steps, the active layer made of n-type $Ga_{0.09}In_{0.10}N$ was formed by a multi-phase structure in which $Ga\alpha In\beta N$ having an indium composition ratio (=β) approximately homogenized to about 3% to 5% for a matrix phase, and approximately spherical or semi-spherical micro-crystals having an indium composition ratio (=β) of about 12% to 15% for sub-phases. A section TEM image showing an internal texture of the n-type $Ga_{0.90}In_{0.10}N$ active layer 109 formed by the multi-phase structure is schematically shown in FIG. 10. The situation was observed, in which a sub-phase T formed from micro-crystals abundant in indium were scattered inside a stratified matrix phase S. It was also recognized that a region U including strains were formed in many regions where the matrix phase S and the sub-phase T contact each other.

In the foregoing stacking structure body, blue light was radiated from the LED fabricated according to the procedures described in Example 1 when an operation current of 20 mA was passed across the LED in a forward direction. The emission intensity measured by use of a general integrating sphere was about 26 μW, which exceeded the emission intensity of the LED of Example 2 by about 24%. The LED of this example differed from the LED of Example 2 only whether or not the active layer was a multi-phase structure. Accordingly, as is specifically described in this example, the active layer composed of the multi-phase structure apparently exhibited an effect to enhance the emission intensity.

Example 5

In the description of this example, the present invention will be described using a case where an LED equipped with an active layer of a multi-phase structure according to the sixth embodiment.

In this example, on the stacking structure body similar to Example 4, an n-type $Ga_{0.90}In_{0.10}N$ active layer and a p-type $Al_xGa_yN$ composition gradient layer were grown, and thereafter the cooling rate in the cooling step was changed, thus forming the active layer composed of the multi-phase structure according to the sixth embodiment. The cooling rate from 1050° C. for growing the p-type $Al_xGa_yN$ composition gradient layer to 950° C. was set to 30° C. per minute, and the cooling rate from 950° C. to 650° C. was set to 10° C. per minute.

In Example 5, since the cooling rate was set to be slower than that of Example 4, the difference of the indium composition ratio between the matrix phase and sub-phase of the active layer became more marked, and the matrix phase came to be mainly made of GaN having an indium atom concentration of about $8\times10^{19}$ cm$^{-3}$. Accordingly, the active layer taking the non-rectangular potential structure of this example came to be formed of the multi-phase structure in which GaN approximately identical to the material forming the upper end layer of the super lattice structure was used as the matrix phase. On the other hand, the tendency to increase inversely the indium composition ratio of the micro crystals composing the sub-phase was recognized, and the indium composition ratio thereof was about 15% in average. The tendency to enlarge the size of the sub-phase due to fusion of the micro crystals with others by lowering the cooling rate was also recognized. Both tendencies implied phenomenon based on an Ostwald ripening effect as to quantum dots of II–VI compound semiconductor CdTe (see *Oyo Butsuri (Applied Physics)*, Vol. 67, No. 7, 1998, 802–812., and *J. Crystal Growth*, 184/185, 1998, 228–236).

When an operation current of 20 mA was passed across the LED fabricated from the foregoing stacking structure body according to the procedures described in Example 1, a bluish green light having a central wavelength of about 470 nm was radiated from the LED. An emission intensity measured using a general integrating sphere was about 28 μW, and it was a high emission intensity exceeding that of the LED of Example 2 by about 33% even though there was a difference in wavelengths of the emitted lights. Furthermore, the emission intensity of the LED of Example 5 was excellent compared to that of Example 4 comprising the active layer formed of the similar multi-phase structure. In the forming of the active layer formed by the multi-phase structure, the matrix-phase of the multi-phase structure was made from the same compositional group-III nitride semi-conductor material as that of the upper end layer of the super lattice structure that was the "deposited layer" whereby it was proved that higher emission intensity was obtained.

Example 6

In the description of this example, the present invention will be described using a case where an LED 1 was fabricated from the stacking structure body 2 comprising the form according to the invention described in both of the seventh and eighth embodiments.

Figure 11:
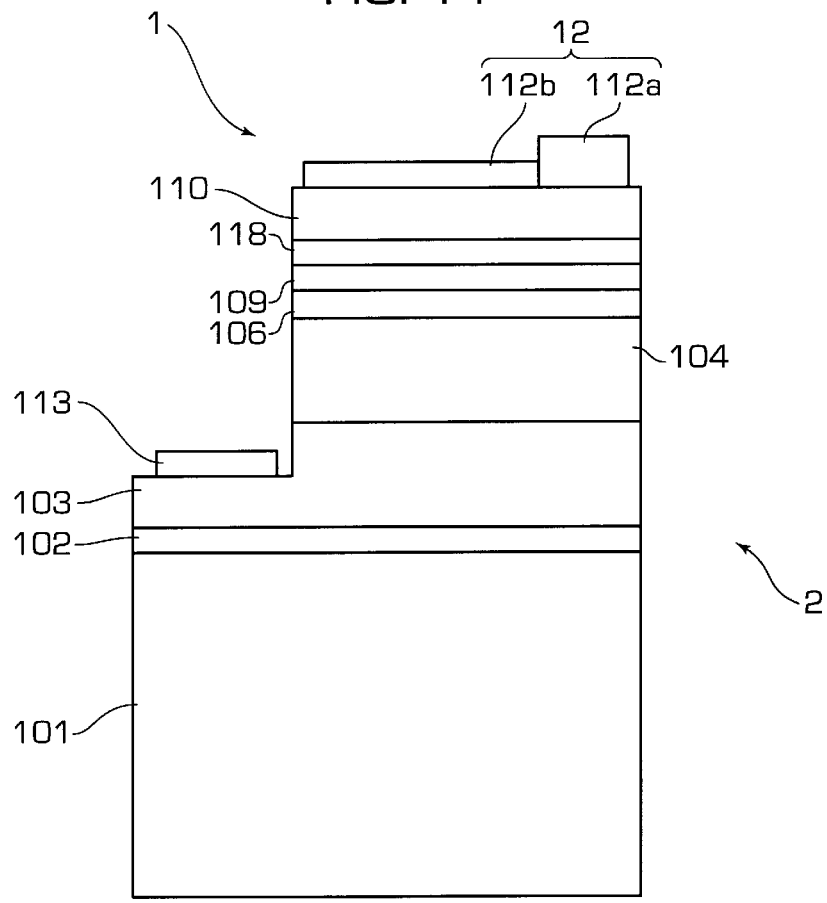
FIG. 11 is a schematic sectional view of an LED according to Example 6 of the present invention.

FIG. 11 is a schematic view showing a sectional structure of the LED 1 fabricated in this example. A stacking structure from a sapphire substrate 101 to an n-type $Ga_{0.80}In_{0.20}N$ active layer 109 interposing a super lattice structure 104 therebetween was the same as that of Example 3. The super lattice structure 104 has an upper end layer 106 made of n-type $Al_{0.05}Ga_{0.95}N$.

The growth of the n-type $Ga_{0.80}In_{0.20}N$ active layer 109 was completed, by an atmospheric pressure MOCVD method. After an interruption of the growth for 10 minutes, an undoped n-type $Al_{0.15}Ga_{0.85}N$ layer 118 of a high resistance was stacked on the active layer 109. The reason why the growth interruption time was two times longer than that of Example 1 was to create a bending portion of a conduction band falling within the active layer 109 decreasing sufficiently toward a Fermi level by further enhancing abruptness at the junction interface of the active layer 109 and the $Al_{0.15}Ga_{0.85}N$ layer 118. The thickness of the high resistance $Al_{0.15}Ga_{0.85}N$ layer 118 with a carrier concentration of $1\times10^{17}$ cm$^{-3}$ or less was set to 3 nm. This high purity n-type $Al_{0.15}Ga_{0.85}N$ layer 118 was provided for effectively accumulating electrons at a specified region of a potential well portion formed in the n-type $Ga_{0.80}In_{0.20}N$ active layer 109.

A Mg-doped p-type $Al_xGa_yN$ (X=0.15→0) composition gradient layer 110 was deposited on the n-type $Al_{0.15}Ga_{0.85}N$ layer 118, thus completing the formation of a stacking structure body 2. According to a concentration analysis of constituent elements from the surface to the deeper part of the stacking structure body 2 by a SIMS, it was recognized that Mg which was a dopant of the p-type $Al_xGa_yN$ layer 110 diffused into the undoped n-type $Al_{0.15}Ga_{0.85}N$ layer 118. Moreover, it was recognized that the abruptness of an aluminum composition in the junction interface of the $Ga_{0.80}In_{0.20}N$ active layer 109 and the high resistance n-type $Al_{0.15}Ga_{0.85}N$ layer 118 was about 9 nm.

P and n-type Ohmic electrodes 112 and 113 having the same form as those of Example 1 were formed on the foregoing stacking structure body to fabricate LED 1. It was observed that the central wavelength of the emitted light was about 505 nm longer than that of LED of Example 3. Occurrence of subsidiary spectrum was not substantially recognized like Example 3 in addition to the main emission spectrum. However, the feature of this example was that the LED with a high speed response superior to the LED of Example 3 was obtained. When the LED of this example was compared with that of Example 3 by pulse response time indicating concretely superiority of response, the pulse response time of this example was about 16 ps while the pulse response time of Example 3 was about 20 ps. According to the form of this example, the LED exhibiting a higher response can surely be obtained.

Example 7

In forming the active layer 109 by $Ga_{0.80}In_{0.20}N$ described in Example 6, the thickness of the active layer 109 was reduced to 3 nm. The gradient of the Al composition (=X) in the $Al_xGa_yN$ composition gradient layer 110 stacked thereon was changed from 0.25 to 0 (X=0.25 to 0). Accordingly, the active layer 109 having a thickness smaller than that of Example 6 was joined to a p-type cladding layer 110 having a higher aluminum composition ratio than that of Example 6.

The LED fabricated from the foregoing stacking structure body according to the procedures described in Example 1 did not show a significant difference in its response time compared to that of the LED of Example 6. However, it was observed that the wavelength of the emitted light was still longer, that is, 520 nm. Specifically, it was proved that the wavelength of the emitted light was made to be longer even when the composition ratio (=Z) of the $Ga_yIn_zN$ mixed-crystal forming the active layer was not changed so much, that is, kept approximately constant by simply reducing the thickness of the active layer and increasing the aluminum composition ratio (=X) of the p-type $Al_xGa_yN$ layer serving as both of the cladding layer and the contact layer at the junction interface with the active layer. By the way, in the case of this embodiment, the inherent band gap of $Ga_{0.80}In_{0.20}N$ forming the active layer was about 2.9 eV. (see Japanese Examined Patent Publication No. S55-3834). On the other hand, the transition energy corresponding to the wavelength of the emitted light obtained was calculated as about 2.4 eV. Accordingly, this example resulted in a reduction in the transition energy by about 0.5 eV. Moreover, the emission intensity of the LED in the chip was as high as about 30 μW.

Since the invention described in the first embodiment is formed by providing an active layer that is a substantial light-emitting layer on a super lattice structure, the active layer with excellent crystallinity, in which a propagation of crystal defects thereto is suppressed, can be obtained, whereby a light-emitting device (LED) with a high emission intensity can be obtained. Since in the invention described this first embodiment, the active layer has a form in which a low potential portion due to bending of the band inheres therein, the group-III nitride semiconductor light-emitting device capable of emitting light with a comparatively long wavelength can readily be provided.

The inventions described in embodiments 2 to 4 exhibit an effect that a group-III nitride semiconductor light-emitting device capable of emitting light with excellent monochromaticity can be obtained. Particularly, in the invention of embodiment 2, the super lattice structure having the active layer deposited thereon is formed by the non-quantum structure which produces no unnecessary quantum level to generate any subsidiary emission spectrum, thus obtaining a light emission with excellent monochromaticity. Furthermore, in the invention of the third embodiment, since the active layer adopts the quantum well structure intrinsically expedient to emit light with excellent monochromaticity, the invention of the third embodiment can exhibit an effect to enhance the monochromaticity of the emitted light. Furthermore, in the invention of the fourth embodiment, since the active layer is composed of a single layer, the invention of this embodiment exhibits an effect to emit light with excellent monochromaticity without occurrence of an additional quantum level.

The inventions described in embodiments 5 and 6 in which the active layer is formed of the crystal layers of the multi-phase structure having different indium compositions exhibit an effect to obtain a group-III nitride semiconductor light-emitting device with excellent emission intensity. Particularly, in the invention of the sixth embodiment, since the matrix phase of the multi-phase structure is formed of approximately the same material as that of the underneath layer, the quality of monochromaticity of the active layer is markedly improved, and hence a group-III nitride semiconductor light-emitting device with more excellent emission intensity can be obtained.

When the band structure described in the inventions of embodiments 7 and 8, is employed, use of conventional technical means for forming the active layer with a GaInN crystal which has poor monochromaticity due to an increase of the indium composition ratio is avoided, and the inventions of these two embodiments can exhibit an effect to readily allow the wavelength of the emitted light to be longer. Particularly, the form in which the high purity n-type crystal layer is arranged between the active layer and the p-type cladding layer described in the invention of embodiment 8 can readily bend the band within the active layer more securely, thus exhibiting an effect to produce a group-III nitride semiconductor light-emitting device which is capable of emitting light of a long wavelength.

While the invention has been described in detail and with reference to specific embodiments thereof, it will be apparent to one skilled in the art that various changes and modifications can be made therein without departing from the spirit and scope thereof.

What is claimed is:

1. A group-III nitride semiconductor light-emitting device which takes a pn-junction type double hetero (DH) junction structure which comprises an n-type cladding layer and a p-type cladding layer formed on one surface of a single crystal substrate, and a light-emitting layer made of a group-III nitride semiconductor crystal layer provided between the n and p-type cladding layers, wherein the light-emitting layer includes a super lattice structure in which n-type group-III nitride semiconductor crystal layers disposed closer to the n-type cladding layer are alternately stacked repeatingly, the n-type group-III nitride semiconductor crystal layers having different composition ratios of a group-III constituent element and approximately the same thickness and the stacking cycle number ranging from two pairs to twenty five pairs; and an active layer made of an n-type group-III nitride semiconductor crystal layer provided on a layer as an upper end layer which is located at an end of the super lattice structure closer to the p-type cladding layer, the n-type group-III nitride semiconductor crystal layer having a non-rectangular potential structure due to a bend of a band.

2. The group-III nitride semiconductor light-emitting device according to claim 1, wherein said super lattice structure is the one assuming a non-quantum well structure in which two kinds of layers made of conductive n-type aluminum gallium indium nitride mixed-crystal of the formula $Al_xGa_yIn_zN$: $0 \leq X<1$, $0 \leq Y<1$, $0 \leq Z<1$, $X+Y+Z=1$ are alternately stacked on another, each of the layers having a difference of 5 nm or less in thickness and a different composition ratio in a group-III constituent element.

3. The group-III nitride semiconductor light-emitting device according to any one of claims 1 or 2, wherein the active layer is formed of a well layer that is an end layer of a quantum well structure adjacent the p-type cladding layer, the quantum well structure being composed of a stacking structure composed of the well layers including the well layer and barrier layers which are alternately stacked with a stacking cycle number of 5 or less, the well layers being made of a gallium indium nitride mixed-crystal of the formula $Ga_yIn_zN$: $0.7 \leq Y<1$, $0<Z \leq 0.3$, $Y+Z=1$ having an indium composition ratio of 0.3 or less, and the barrier layers being made of a gallium indium nitride mixed-crystal of the formula $Ga_BIn_CN$: $Y<B<1$, $0<C<Z$, $B+C=1$ having an indium composition ratio smaller than that of the $Ga_yIn_zN$ mixed-crystal.

4. The group-III nitride semiconductor light-emitting device according to any one of claims 1 or 2, wherein the active layer is made of a single gallium indium nitride mixed-crystal layer directly joined to the upper end layer of the super lattice structure.

5. The group-III nitride semiconductor light-emitting device according to any one of claims 1 or 2, wherein said active layer is made of a gallium indium nitride mixed-crystal of a multi-phase structure which is composed of a plurality of $Ga_\alpha In_\beta N$ crystal phases where $0 \leq \alpha<1$, $\alpha+\beta=1$, each crystal phase having a different indium composition ratio ($=\beta$) from the other crystal phases.

6. The group-III nitride semiconductor light-emitting device according to claim 5, wherein said active layer comprises a matrix phase mainly of an n-type group-III nitride semiconductor crystal of the same composition as that of an n-type group-III nitride semiconductor, which forms a lower deposited layer stacking the active layer thereon; and a sub-phase made of a $Ga_\alpha In_\beta N$ crystal having an indium composition ratio different from that of the matrix phase where $\alpha$ and $\beta$ are as described in claim 5.

7. The group-III nitride semiconductor light-emitting device according to any one of claims 1 or 2, wherein the active layer is made of an n-type gallium indium nitride mixed-crystal of the formula $Ga_yIn_zN$: $0.7 \leq Y<1$, $0<Z \leq 0.3$ and $Y+Z=1$ having a band structure in which a bending portion of a conduction band or a valence band bends toward a Fermi level at a region in the vicinity of a junction interface closer to the p-type cladding layer and an indium composition ratio ($=Z$) of 0.3 or less.

8. The group-III nitride semiconductor light-emitting device according to any one of claims 1 or 2, wherein an n-type aluminum gallium nitride mixed-crystal of the formula $Al_xGa_yN$: $0 \leq X<1$, $0 \leq Y<1$, $X+Y=1$ containing p-type impurities is grown between active layer and the p-type cladding layer, and the active layer is made of an n-type gallium indium nitride mixed-crystal of the formula $Ga_yIn_zN$: $0.7 \leq Y<1$, $0<Z \leq 0.3$, $Y+Z=1$ having a band structure in which a bending portion of a conduction band bends toward a Fermi level at a region in the vicinity of a junction interface with the n-type aluminum gallium nitride mixed-crystal containing the p-type impurities, and an indium composition ratio ($=Z$) of 0.3 or less.

* * * * *